United States Patent
Ishiguri et al.

(10) Patent No.: US 11,342,259 B2
(45) Date of Patent: May 24, 2022

(54) ELECTRONIC MODULE, ELECTRONIC DEVICE, MANUFACTURING METHOD FOR ELECTRONIC MODULE, AND MANUFACTURING METHOD FOR ELECTRONIC DEVICE

(71) Applicant: CANON KABUSHIKI KAISHA, Tokyo (JP)

(72) Inventors: Shingo Ishiguri, Yokohama (JP); Mitsutoshi Hasegawa, Yokohama (JP); Kunihiko Minegishi, Yokohama (JP); Takashi Sakaki, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/087,102

(22) Filed: Nov. 2, 2020

(65) Prior Publication Data
US 2021/0074626 A1     Mar. 11, 2021

Related U.S. Application Data

(63) Continuation of application No. 16/426,464, filed on May 30, 2019, now Pat. No. 10,861,785.

(30) Foreign Application Priority Data

Jun. 18, 2018   (JP) .............................. JP2018-115579
Apr. 16, 2019   (JP) .............................. JP2019-077628

(51) Int. Cl.
*H01L 23/52*     (2006.01)
*H01L 27/146*    (2006.01)
(Continued)

(52) U.S. Cl.
CPC .......... *H01L 23/52* (2013.01); *H01L 21/4871* (2013.01); *H01L 23/488* (2013.01); (Continued)

(58) Field of Classification Search
CPC ............. H01L 21/4814; H01L 21/4853; H01L 21/4871; H01L 21/4875; H01L 21/54; (Continued)

(56) References Cited

U.S. PATENT DOCUMENTS 7,966,721 B2   6/2011   Wada et al.
10,076,037 B2  9/2018   Minegishi
(Continued)

FOREIGN PATENT DOCUMENTS

JP        2006-186011 A     7/2006

*Primary Examiner* — Cheung Lee
(74) *Attorney, Agent, or Firm* — Venable LLP

(57) ABSTRACT

An electronic module includes an electronic part including a bottom surface and lands, the bottom surface including a first region and a third region surrounding the first region, the first lands being disposed in the third region, a printed wiring board including a main surface and second lands, the main surface including a second region and a fourth region surrounding the second region, the main surface facing the bottom surface of the electronic part, the second lands being disposed in the fourth region, solder bonding portions respectively bonding the first lands to the second lands, and a resin portion containing a cured product of a thermosetting resin and being in contact with the solder boding portions. A recess portion is provided in the second region. The resin portion is not provided in the recess portion.

22 Claims, 16 Drawing Sheets

(51) Int. Cl.
*H01L 23/498* (2006.01)
*H01L 23/00* (2006.01)
*H01L 21/48* (2006.01)
*H01L 23/488* (2006.01)

(52) U.S. Cl.
CPC ........ *H01L 23/49838* (2013.01); *H01L 24/06* (2013.01); *H01L 27/14636* (2013.01)

(58) Field of Classification Search
CPC ....... H01L 21/56; H01L 21/563; H01L 23/28; H01L 23/31; H01L 23/48; H01L 23/488; H01L 23/492; H01L 23/495; H01L 23/49503; H01L 23/498; H01L 23/49838; H01L 23/52; H01L 23/522; H01L 23/538; H01L 24/06; H01L 24/09; H01L 24/10; H01L 24/42; H01L 27/14636
See application file for complete search history.

(56) References Cited

U.S. PATENT DOCUMENTS

| | | | |
|---|---|---|---|
| 2010/0252304 A1* | 10/2010 | Muramatsu | H01L 21/563 174/251 |
| 2012/0188735 A1 | 7/2012 | Hiroshima et al. | |
| 2017/0141023 A1* | 5/2017 | Arisaka | H01L 24/16 |
| 2018/0063960 A1 | 3/2018 | Sasaki et al. | |
| 2018/0173080 A1 | 6/2018 | Enta | |
| 2018/0242462 A1 | 8/2018 | Minegishi et al. | |
| 2019/0342991 A1 | 11/2019 | Hasegawa et al. | |

* cited by examiner

ELECTRONIC MODULE, ELECTRONIC DEVICE, MANUFACTURING METHOD FOR ELECTRONIC MODULE, AND MANUFACTURING METHOD FOR ELECTRONIC DEVICE

CROSS-REFERENCE TO RELATED APPLICATIONS

This application is a continuation application of U.S. patent application Ser. No. 16/426,464, filed May 30, 2019, which claims the benefit of Japanese Patent Application No. 2018-115579, filed Jun. 18, 2018, and Japanese Patent Application No. 2019-077628, filed Apr. 16, 2019. All of these prior applications are hereby incorporated by reference herein in their entirety.

BACKGROUND OF THE INVENTION

Field of the Invention

The present invention relates to an electronic module, an electronic device, a manufacturing method for an electronic module, and a manufacturing method for an electronic device.

Description of the Related Art

An image pickup apparatus such as a digital camera or a smartphone including a camera serving as an example of an electronic device includes a printed circuit board that is one example of an electronic module including an electronic part such as an image sensor. The printed circuit board includes a printed wiring board on which the electronic part is mounted. As the image pickup apparatus is miniaturized and improved in performance, the electronic part is also miniaturized and improved in performance. Packages such as land grid array: LGA and leadless chip carrier: LCC which can be miniaturized and in which a large number of terminals can be arranged are employed for electronic parts used for the image pickup apparatus. These packages can be miniaturized because lands serving as terminals are disposed on a main surface of the package and thus lead terminals are not needed. The lands of the package and lands of the printed wiring board are bonded via solder bonding portions including solder. However, the solder bonding portions sometimes get disconnected depending on the use condition. For example, the solder bonding portions sometimes get disconnected by an impact of drop when the image pickup apparatus is dropped. In addition, when the performance of the electronic part is improved, the amount of heat generated in operation of the electronic part increases, thus the amount of thermal expansion of the electronic part increases, and the amount of deformation of the electronic part increases as a result of this. Therefore, stress is applied to the solder bonding portions and the solder bonding portions sometimes get disconnected.

There is known a method of reinforcing the solder bonding portions by underfill containing resin to suppress disconnection of the solder bonding portions. Japanese Patent Laid-Open No. 2006-186011 discloses a method of mounting an electronic part on a printed wiring board by using a paste of mixture of solder powder and thermosetting resin. When this kind of paste is heated to a temperature equal to or higher than the melting point of solder, the paste separates into solder and uncured thermosetting resin. The uncured thermosetting resin separated around the solder is eventually cured by a curing reaction caused by heating.

Incidentally, further miniaturization of the electronic part is demanded. Since the pitch between the lands of the electronic part needs to be further reduced to further miniaturizing the electronic part, the solder bonding portions need to be miniaturized. In this case, it is required that the reliability of bonding by the solder bonding portions is improved.

SUMMARY OF THE INVENTION

According to a first aspect of the present invention, an electronic module includes an electronic part including a bottom surface and a plurality of first lands, the bottom surface including a first region and a third region surrounding the first region, the plurality of first lands being disposed in the third region, a printed wiring board including a main surface and a plurality of second lands, the main surface including a second region and a fourth region surrounding the second region, the main surface facing the bottom surface of the electronic part, the plurality of second lands being disposed in the fourth region, a plurality of solder bonding portions respectively bonding the plurality of first lands to the plurality of second lands, and a resin portion containing a cured product of a thermosetting resin and being in contact with the plurality of solder boding portions. A recess portion is provided in the second region. The resin portion is not provided in the recess portion.

According to a second aspect of the present invention, an electronic module includes an electronic part including a bottom surface and a plurality of first lands, the bottom surface including a first region and a third region surrounding the first region, the plurality of first lands being disposed in the third region, a printed wiring board including a main surface and a plurality of second lands, the main surface including a second region and a fourth region surrounding the second region, the main surface facing the bottom surface of the electronic part, the plurality of second lands being disposed in the fourth region, a plurality of solder bonding portions respectively bonding the plurality of first lands to the plurality of second lands, and a resin portion containing a cured product of a thermosetting resin and being in contact with the plurality of solder boding portions. The resin portion is in contact with the first region at an acute angle.

According to a third aspect of the present invention, a manufacturing method for an electronic module includes preparing an electronic part and a printed wiring board, the electronic part including a bottom surface and a plurality of first lands, the bottom surface including a first region and a third region surrounding the first region, the plurality of first lands being disposed in the third region, the printed wiring board including a main surface and a plurality of second lands, the main surface including a second region in which a recess portion is provided and a fourth region surrounding the second region, the main surface facing the bottom surface of the electronic part, the plurality of second lands being disposed in the fourth region, providing a paste containing solder powder and uncured thermosetting resin on each of the plurality of second lands, mounting the electronic part on the printed wiring board such that the plurality of the first lands respectively face the plurality of second lands, and heating the paste to form a plurality of solder bonding portions bonding the plurality of first lands to the plurality of second lands and form a resin portion such that the resin portion is in contact with the plurality of solder bonding portions and is not present in the recess portion.

Further features of the present invention will become apparent from the following description of exemplary embodiments with reference to the attached drawings.

DESCRIPTION OF THE EMBODIMENTS

Exemplary embodiments of the present invention will be described below in detail with reference to drawings.

First Exemplary Embodiment

Figure 1:
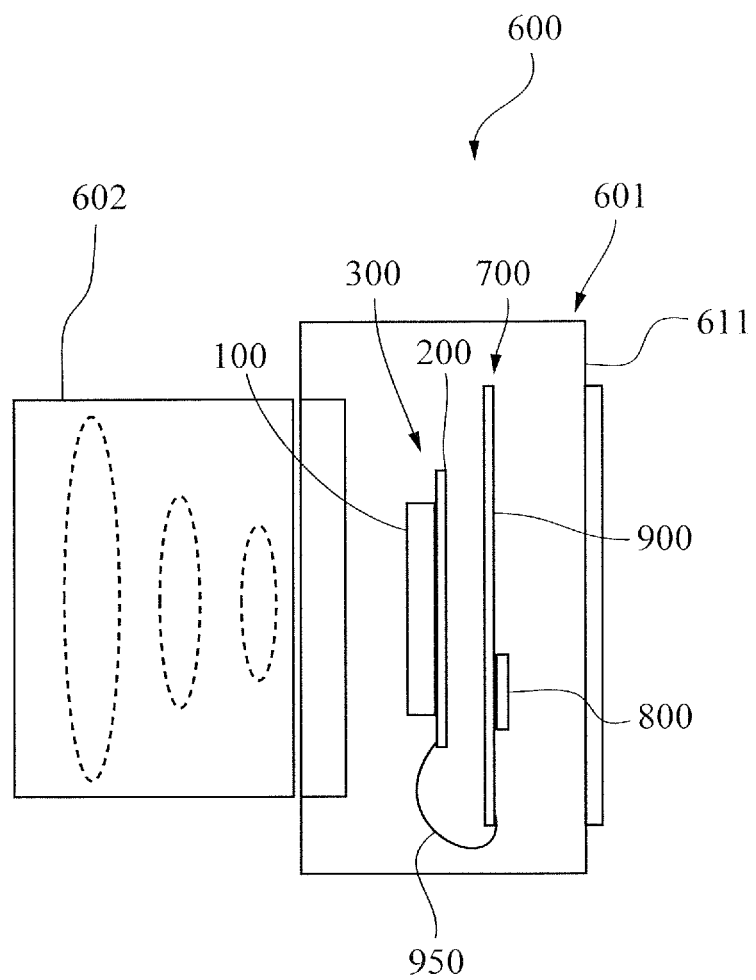
FIG. 1 is an explanatory diagram illustrating a digital camera serving as an example of an electronic device according to a first exemplary embodiment.

FIG. 1 is an explanatory diagram of a digital camera 600 that is an image pickup apparatus serving as an example of an electronic device according to a first exemplary embodiment. The digital camera 600 that is an image pickup apparatus is a digital camera with a replaceable lens unit, and includes a camera body 601. A lens unit 602 that is a lens barrel including a lens is detachably mounted on the camera body 601. The camera body 601 includes a casing 611 and printed circuit boards 300 and 700 serving as examples of an electronic module disposed in the casing 611. The printed circuit boards 300 and 700 are electrically interconnected via a cable 950.

The printed circuit board 300 includes an image sensor 100 serving as an example of an electronic part, and a printed wiring board 200 on which the image sensor 100 is mounted. The printed circuit board 700 includes an image processing device 800 serving as an example of an electronic part, and a printed wiring board 900 on which the image processing device 800 is mounted.

For example, the image sensor 100 is a complementary metal oxide semiconductor image sensor: CMOS image sensor, or a charge coupled device image sensor: CCD image sensor. The image sensor 100 has a function of converting light incident through the lens unit 602 into an electric signal.

For example, the image processing device 800 is a digital signal processor. The image processing device 800 has a function of obtaining an electric signal from the image sensor 100, performing a process of correcting the obtained electric signal, and thus generating image data.

Figure 2:
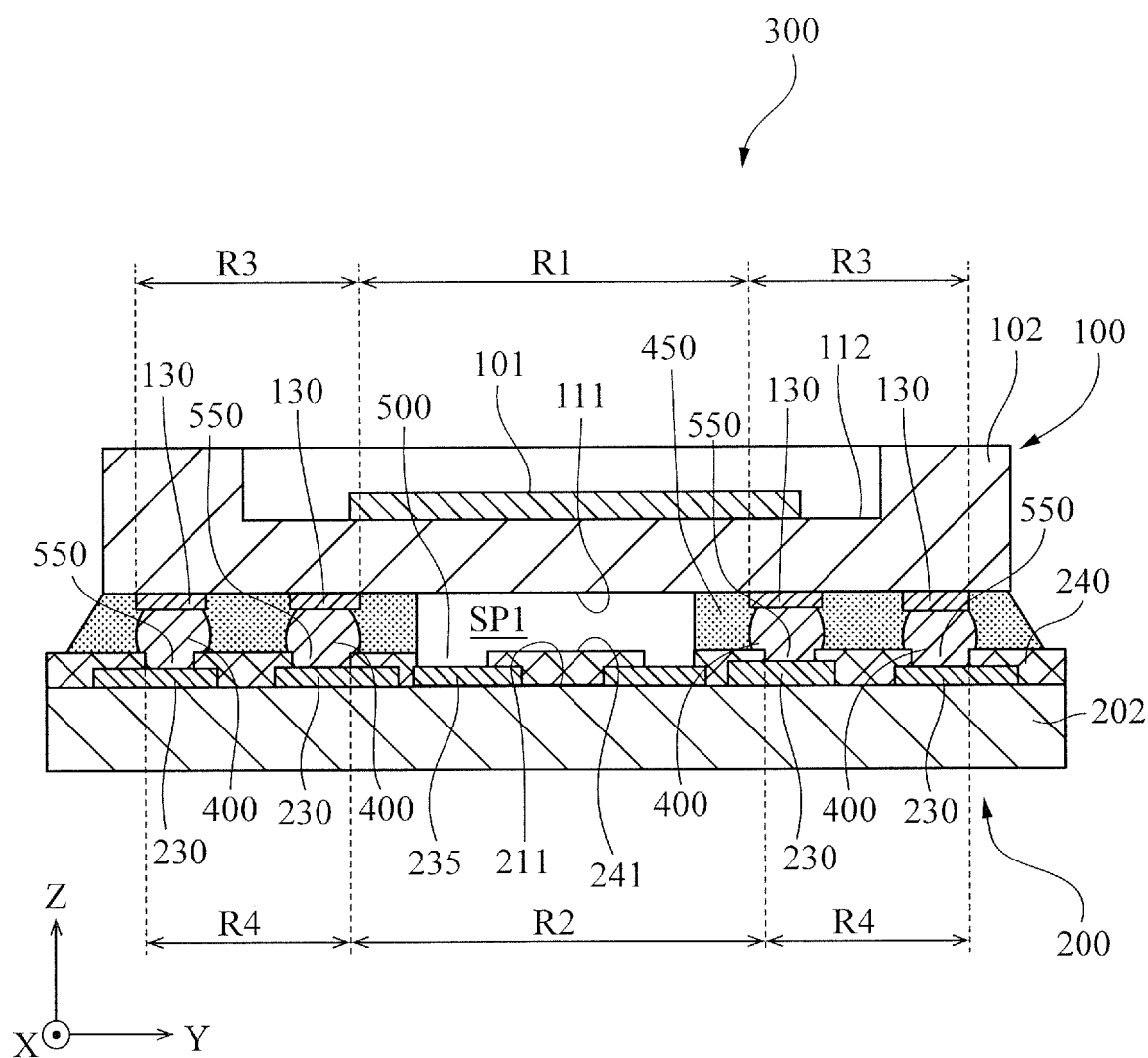
FIG. 2 is a section view of a printed circuit board according to the first exemplary embodiment.

FIG. 2 is a section view of the printed circuit board 300 according to the first exemplary embodiment. The image sensor 100 is an LGA package. To be noted, the image sensor 100 may be an LCC package. The image sensor 100 includes a sensor element 101 that is a semiconductor element, and an insulating substrate 102 that is a first base portion. The insulating substrate 102 includes a main surface 111 serving as a bottom surface of the image sensor 100. The image sensor 100 includes lands 130 serving as a plurality of first lands disposed on the main surface 111 of the insulating substrate 102. The sensor element 101 is disposed on a surface 112 of the insulating substrate 102 opposite to the main surface 111. The lands 130 are electrodes formed from conductive metal such as copper. For example, the lands 130 serve as signal electrodes, power electrodes, ground electrodes, or dummy electrodes. An in-plane direction along the main surface 111 will be referred to as an X-Y direction, and an out-of-plane direction perpendicular to the main surface 111 will be referred to as a Z direction.

Figure 3A:
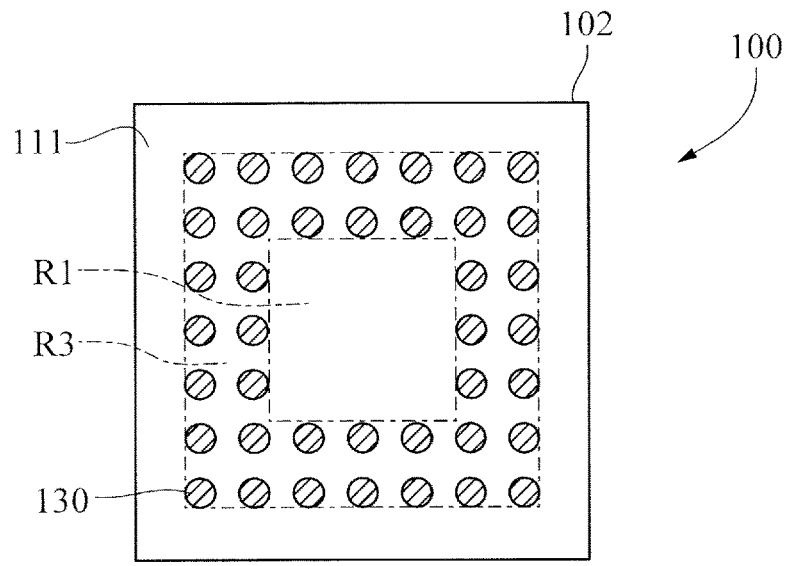
FIG. 3A is a plan view of an image sensor according to the first exemplary embodiment.
Figure 3A:
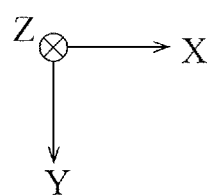

FIG. 3A is a plan view of the image sensor 100 as viewed from the main surface 111 side. The lands 130 each have a circular shape in the plan view, but the shape is not limited to this. The lands 130 each may have a polygonal shape or a + shape in the plan view. The insulating substrate 102 is formed from, for example, ceramics such as alumina.

As illustrated in FIG. 2, the printed wiring board 200 includes an insulating substrate 202 serving as a second base portion. The insulating substrate 202 includes a main surface 211 serving as a main surface of the printed wiring board 200. The printed wiring board 200 includes lands 230 serving as a plurality of second lands disposed on the main surface 211 of the insulating substrate 202. The lands 230 are electrodes formed from conductive metal such as copper. For example, the lands 230 serve as signal electrodes, power electrodes, ground electrodes, or dummy electrodes. The insulating substrate 202 is formed from an insulating material such as epoxy resin.

Figure 3B:
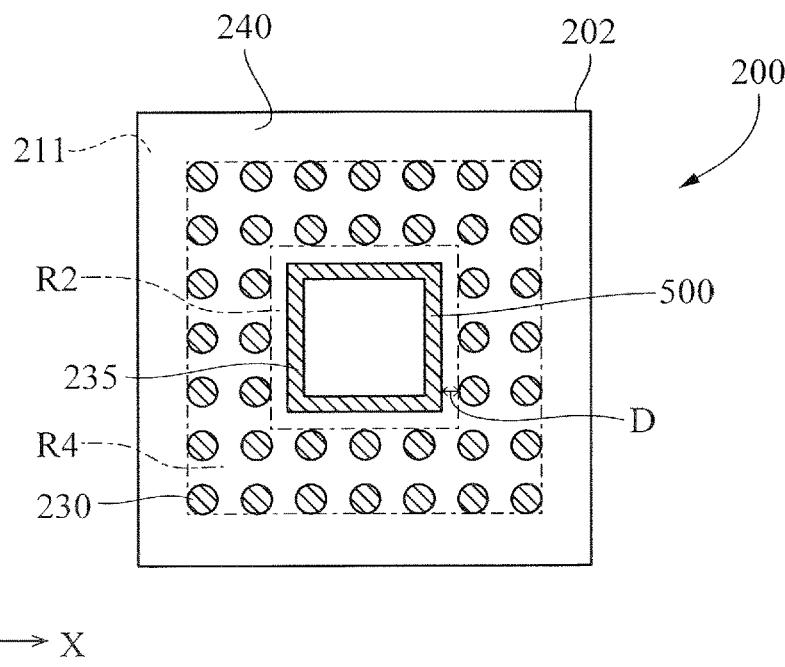
FIG. 3B is a plan view of a printed wiring board according to the first exemplary embodiment.
Figure 3B:
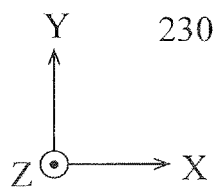

The printed wiring board 200 includes a solder resist layer 240 that is a film of a solder resist. The solder resist layer 240 is provided on the main surface 211. In the present exemplary embodiment, the lands 230 are solder mask defined lands: SMD lands. That is, "lands 230" refers to portions of a conductor pattern formed on the mains surface 211 of the insulating substrate 202, and the portions are exposed through openings 550 defined in the solder resist layer 240 as illustrated in FIG. 2. To be noted, the lands 230 may be non-solder mask defined lands: NSMD lands. FIG. 3B is a plan view of the printed wiring board 200 as viewed from the main surface 211 side. The lands 230 each have a circular shape in the plan view, but the shape is not limited to this. The lands 230 each may have a polygonal shape or a + shape in the plan view.

In the present exemplary embodiment, in the image sensor 100, no solder resist layer is present on the main surface 111 of the insulating substrate 102, and therefore the main surface 111 of the insulating substrate 102 serves as the surface of the package substrate. In addition, in the printed wiring board 200, the solder resist layer 240 is provided on the main surface 211 of the insulating substrate 202, and therefore a surface 241 of the solder resist layer 240 serves as the surface of the printed wiring board 200.

As illustrated in FIG. 2, the plurality of lands 130 are respectively bonded to the plurality of lands 230 via a plurality of solder bonding portions 400 containing solder. In each of the solder bonding portions 400, part not in contact with the lands 130 and 230 and the solder resist layer 240 is covered by a resin portion 450 that is an underfill. On the outer periphery side of a recess portion that will be described later, it is preferable that gaps between the solder bonding portions 400 are filled with the resin portion 450. The resin portion 450 mainly contains a cured product that is a resin material obtained by thermally curing a thermosetting resin. In the present exemplary embodiment, the plurality of solder bonding portions 400 are covered by a single body of the resin portion 450. To be noted, although the plurality of solder bonding portions 400 are preferably covered by a single body of the resin portion 450, the configuration is not limited to this, and the plurality of solder bonding portions 400 may be covered by a plurality of separate resin portions.

As illustrated in FIG. 3A, the main surface 111 includes a region R1 serving as a first region and a region R3 serving as a third region surrounding the region R1. The plurality of lands 130 are arranged in the region R3 with intervals therebetween. The region R1 is a rectangular region of the maximum size among a region surrounded by lands 130 positioned on the most inner peripheral side among the plurality of lands 130. The region R1 is a region including the center of the main surface 111. As illustrated in FIG. 3B, the main surface 211 includes a region R2 serving as a second region and a region R4 serving as a fourth region surrounding the region R2. The plurality of lands 230 are arranged in the region R4 with intervals therebetween. The region R2 is a rectangular region of the maximum size among a region surrounded by lands 230 positioned on the most inner peripheral side among the plurality of lands 230. The lands 230 are respectively disposed at positions opposing the lands 130.

The region R1 and the region R2 oppose each other. The region R3 and the region R4 oppose each other. In the solder resist layer 240, an opening 500 serving as a recess portion of the printed wiring board 200 is defined above the region R2. That is, the opening 500 of the solder resist layer 240 serves as a recess portion provided on the main surface 211 of the printed wiring board 200. This recess portion is a portion recessed with respect to a surface on which the image sensor 100 is mounted on the printed wiring board 200, that is, with respect to the surface 241 of the solder resist layer 240 illustrated in FIG. 2. The opening 500 of the solder resist layer 240 is defined in a ring shape as illustrated in FIG. 3B. The opening 500 is a through hole in the first exemplary embodiment, and a conductor pattern 235 provided in the region R2 of the main surface 211 is exposed through the opening 500.

As illustrated in FIG. 2, the gap between the region R3 and the region R4 is filled with the resin portion 450. The resin portion 450 is in contact with the plurality of solder bonding portions 400. A space SP1 in which the resin portion 450 is not present is defined between the region R1 and the region R2, particularly above the opening 500, by the resin portion 450.

A manufacturing method for the printed circuit board 300 will be described. FIGS. 4A, 4B, 4C, 5A, 5B, and 5C are each an explanatory diagram of each step of the method for manufacturing the printed circuit board 300 illustrated in FIG. 2.

Figure 4A:
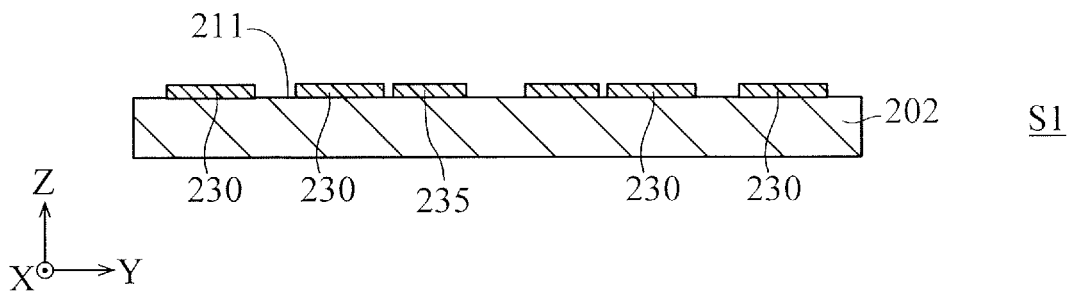
FIG. 4A is an explanatory diagram of a method for manufacturing the printed circuit board according to the first exemplary embodiment.
Figure 4B:
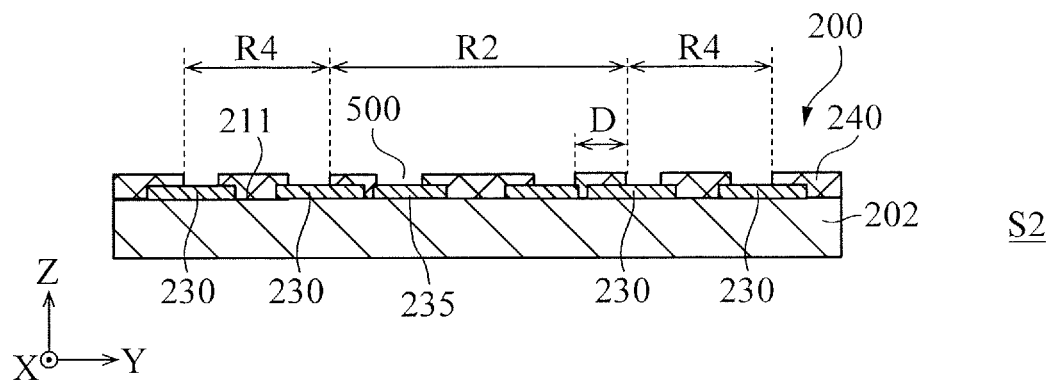
FIG. 4B is an explanatory diagram of the method for manufacturing the printed circuit board according to the first exemplary embodiment.

As illustrated in FIG. 4A, the insulating substrate 202 on which the lands 230 are provided is prepared in step S1. Next, the solder resist layer 240 is formed on one or both of the main surfaces 111 and 211 in step S2. In the present exemplary embodiment, the solder resist layer 240 is formed on the main surface 211. In step S2, the opening 500 is defined at a position corresponding to one or both of the regions R1 and R2. In the present exemplary embodiment, the opening 500 is defined at a position corresponding to the region R2 because the solder resist layer 240 is formed on the main surface 211. To be noted, in step S2, openings through which the lands 230 are exposed are also defined at positions corresponding to the lands 230 in the solder resist layer 240. Although how the opening 500 is defined, that is, how the solder resist layer 240 is formed is not particularly limited, for example, a formation method incorporating photolithography in a manufacturing process of a printed wiring board is economical and is thus preferable.

In the present exemplary embodiment, the conductor pattern 235 provided in the region R2 of the main surface 211 of the insulating substrate 202 is exposed by providing the opening 500 in the solder resist layer 240. The use for this conductor pattern 235 is not particularly limited, and may be, for example, ground lines. By manufacturing the printed wiring board 200 through steps S1 and S2 described above, the printed wiring board 200 is prepared. In addition, the image sensor 100 manufactured in a different manufacturing process is also prepared.

Figure 4C:
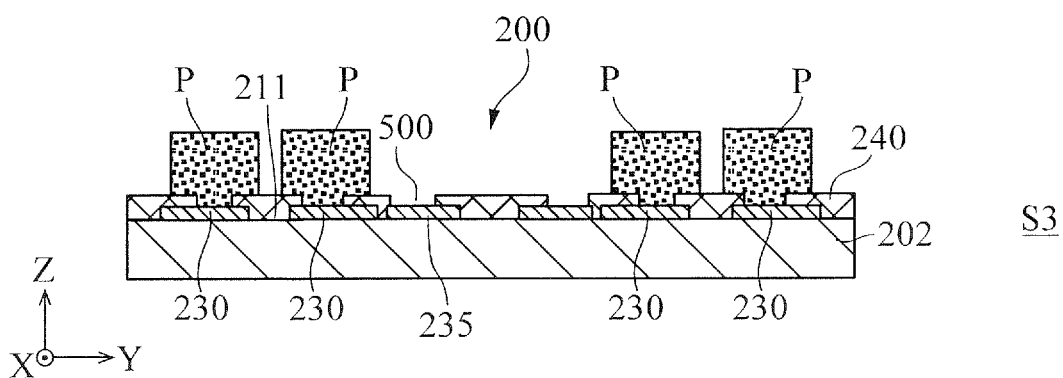
FIG. 4C is an explanatory diagram of the method for manufacturing the printed circuit board according to the first exemplary embodiment.

Next, a paste P is disposed on each of the plurality of lands 230 in step S3 as illustrated in FIG. 4C. The paste P contains solder powder and an uncured thermosetting resin. The thermosetting resin is preferably a thermosetting epoxy resin, and is particularly preferably bisphenol-A epoxy resin. The paste P may further contain a flux component required for soldering.

In step S3, the paste P is supplied to the printed wiring board 200 by screen printing or using a dispenser. To be noted, the paste P may be supplied to cover the entirety of each of the lands 230 as illustrated in FIG. 4C, or, although the illustration thereof is omitted herein, the paste P may be supplied to partially cover each of the lands 230.

Figure 5A:
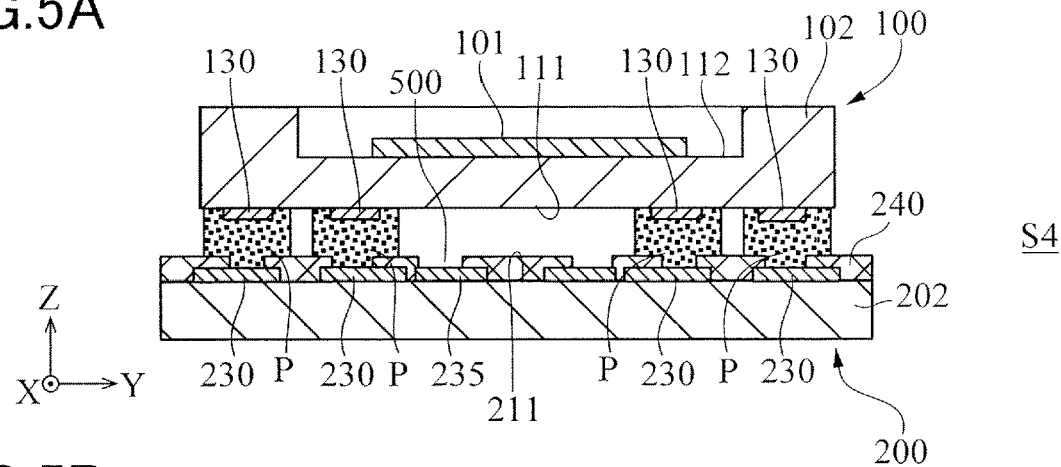
FIG. 5A is an explanatory diagram of the method for manufacturing the printed circuit board according to the first exemplary embodiment.

Next, as illustrated in FIG. 5A, the image sensor 100 is mounted on the printed wiring board 200 such that the paste P is sandwiched between the lands 130 and the lands 230 in step S4. In the present exemplary embodiment, in step S4, the image sensor 100 is mounted on the printed wiring board 200 by using an unillustrated mounter. At this time, the image sensor 100 is positioned and mounted on the printed wiring board 200 such that the lands 130 oppose the lands 230.

Figure 5B:
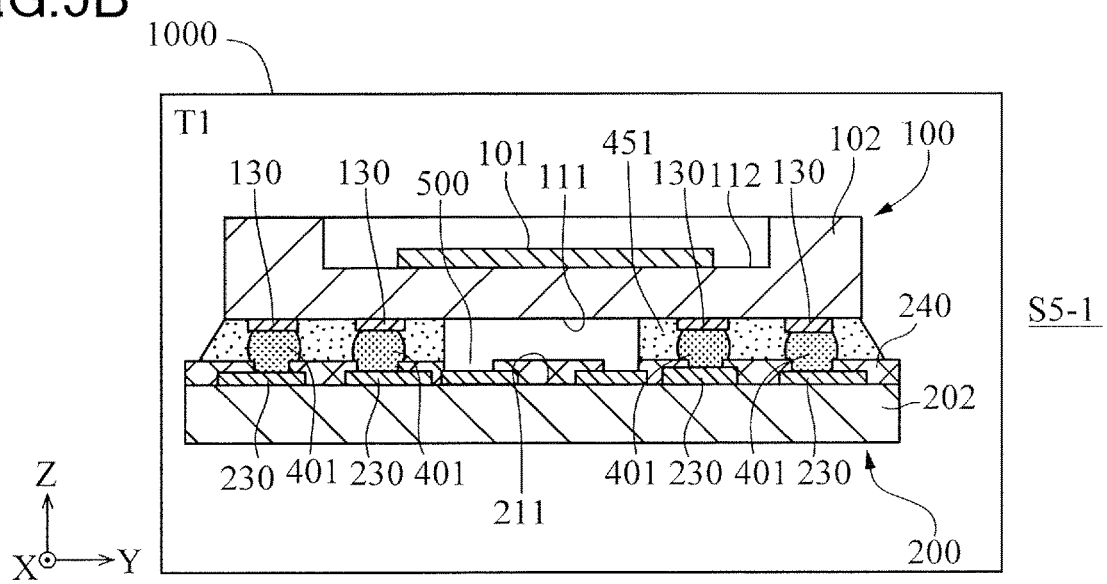
FIG. 5B is an explanatory diagram of the method for manufacturing the printed circuit board according to the first exemplary embodiment.

Next, as illustrated in FIG. 5B, the printed wiring board 200 on which the image sensor 100 is mounted is conveyed to a reflow furnace 1000. Then, in step S5-1 illustrated in FIG. 5B and step S5-2 illustrated in FIG. 5C, the paste P is heated while adjusting the heating temperature in the reflow furnace 1000 and thus the image sensor 100 and the printed wiring board 200 are bonded via solder.

First, step S5-1 illustrated in FIG. 5B will be described. In step S5-1, the temperature inside the reflow furnace 1000 is adjusted to a first temperature T1 equal to or higher than the melting point of the solder powder contained in the paste P. As a result of this, the solder powder in the paste P melts, and thus the paste P separates into molten solder 401 and uncured thermosetting resin 451. Specifically, the thermosetting resin 451 moves to the vicinity of the molten solder 401. Although the first temperature T1 is preferably constant over time, the first temperature T1 may change over time.

Figure 5C:
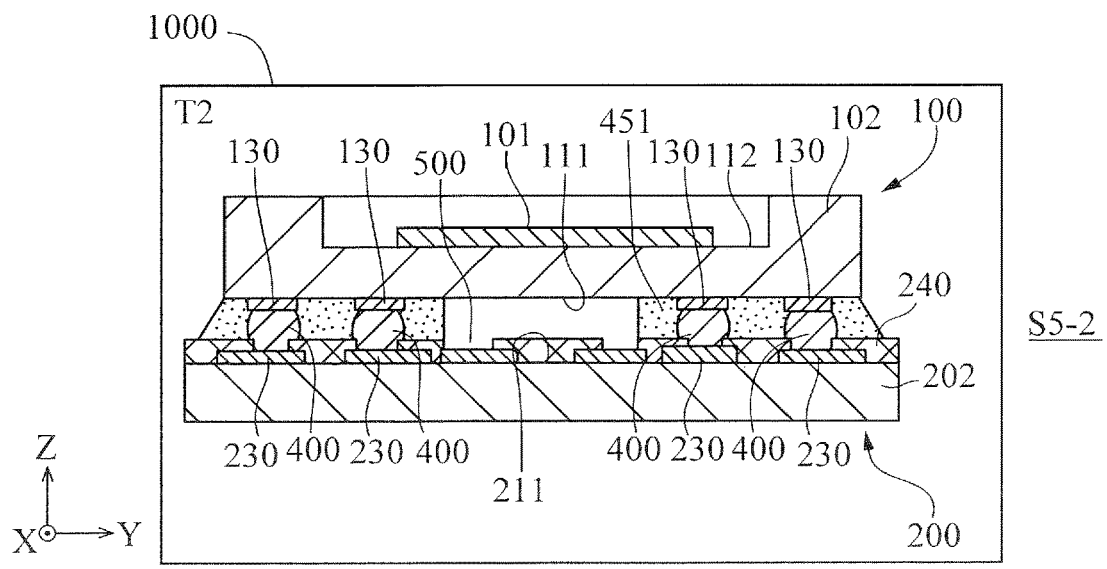
FIG. 5C is an explanatory diagram of the method for manufacturing the printed circuit board according to the first exemplary embodiment.

Then, in step S5-2 illustrated in FIG. 5C, the temperature inside the reflow furnace 1000 is adjusted to a second temperature T2 lower than the melting point of the solder, and thus the molten solder 401 is solidified. That is, T2<T1 holds. As a result of this, the solder bonding portions 400 bonding the lands 130 to the lands 230 are formed. The printed circuit board 300 manufactured in this manner is provided in the casing 611 illustrated in FIG. 1.

The second temperature T2 is also a temperature at which the thermosetting resin 451 is cured, and the temperature inside the reflow furnace 1000 is kept at the second temperature T2 for a period equal to or longer than a predetermined time required for the thermosetting resin 451 to be cured. As a result of this, the thermosetting resin 451 is gradually cured, and thus the resin portion 450 illustrated in FIG. 2 is formed. Although the second temperature T2 is preferably constant over time, the second temperature T2 may change over time.

The solder bonding portions 400, more specifically contact portions between the solder bonding portions 400 and the lands 130 and contact portions between the solder bonding portions 400 and the lands 230 are reinforced by the resin portion 450 illustrated in FIG. 2, and thus the reliability of bonding by the solder bonding portions 400 is improved.

To be noted, although a case where step S5-1 illustrated in FIG. 5B and step S5-2 illustrated in FIG. 5C are continuously performed in the same reflow furnace 1000 has been described, the configuration is not limited to this. In the case where the size of the reflow furnace 1000 is small and sufficient time for step S5-2 cannot be secured, an intermediate product may be moved to an unillustrated heating furnace after the heating in the reflow furnace 1000 of step S5-1, and then the thermosetting resin 451 may be heated to the second temperature T2 to cure.

In step S5-1, the paste P separates into the molten solder 401 in which solder is aggregated and the uncured thermosetting resin 451 flowing around the molten solder 401. At this time, the surface area of the uncured thermosetting resin 451 is smaller than in the paste state, and thus the viscosity thereof apparently decreases and the fluidity thereof increases. The thermosetting resin 451 whose fluidity has increased flows to narrow gaps by a capillary phenomenon.

In addition, one or both of the main surface 111 of the image sensor 100 and the main surface 211 of the printed wiring board 200 does not become a geometrically flat surface when heated to the first temperature T1. That is, one or both of the image sensor 100 and the printed wiring board 200 is warped by the heating. Depending on the state of this warpage, the gap between the image sensor 100 and the printed wiring board 200 on the center side of the image sensor 100 is sometimes relatively narrow with respect to on the outer peripheral side of the image sensor 100. The center side of the image sensor 100 is a region where no land is provided, and therefore the paste P is not supplied to the region. Since the pitch between the lands 130 is reduced as a result of miniaturization of the image sensor 100, the solder bonding portions 400 also needs to be miniaturized, and as a result, the interval between the image sensor 100 and the printed wiring board 200 is reduced and the capillary phenomenon is more likely to occur.

Therefore, in the present exemplary embodiment, the opening 500 where no solder resist is provided is provided over the region R2 opposed to the region R1 positioned on the center side of the image sensor 100. As a result of this opening 500, the space is larger than in a state where the opening 500 is not provided, that is, than in a state where a solder resist is present, and therefore flow of resin caused by the capillary phenomenon is suppressed.

Figure 6A:
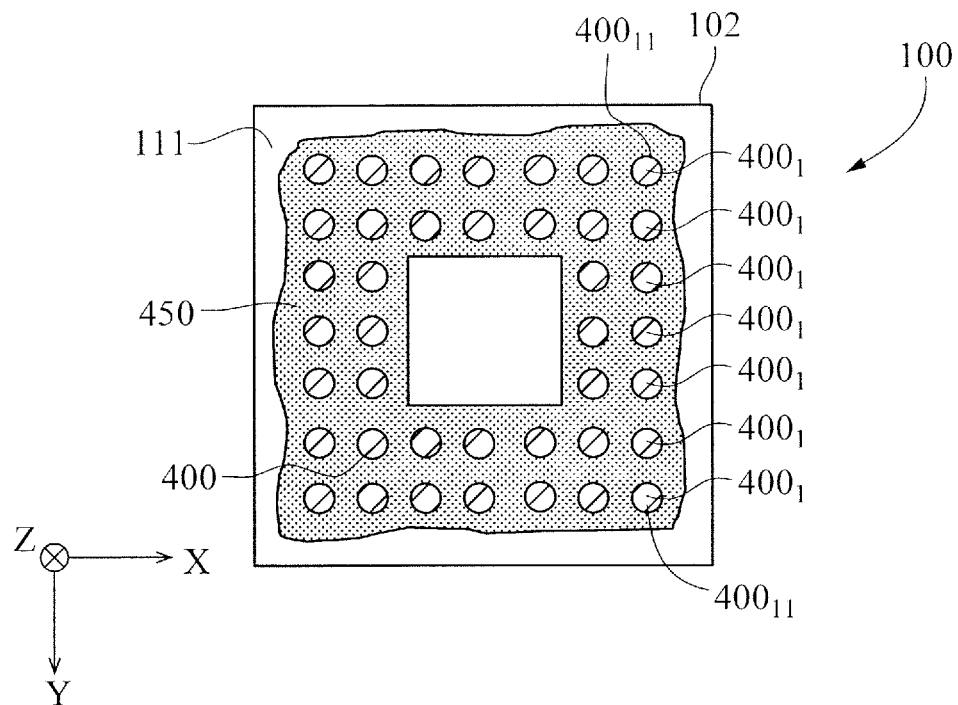
FIG. 6A is a schematic view of the image sensor when the printed circuit board according to the first exemplary embodiment is cut in an in-plane direction.
Figure 6B:
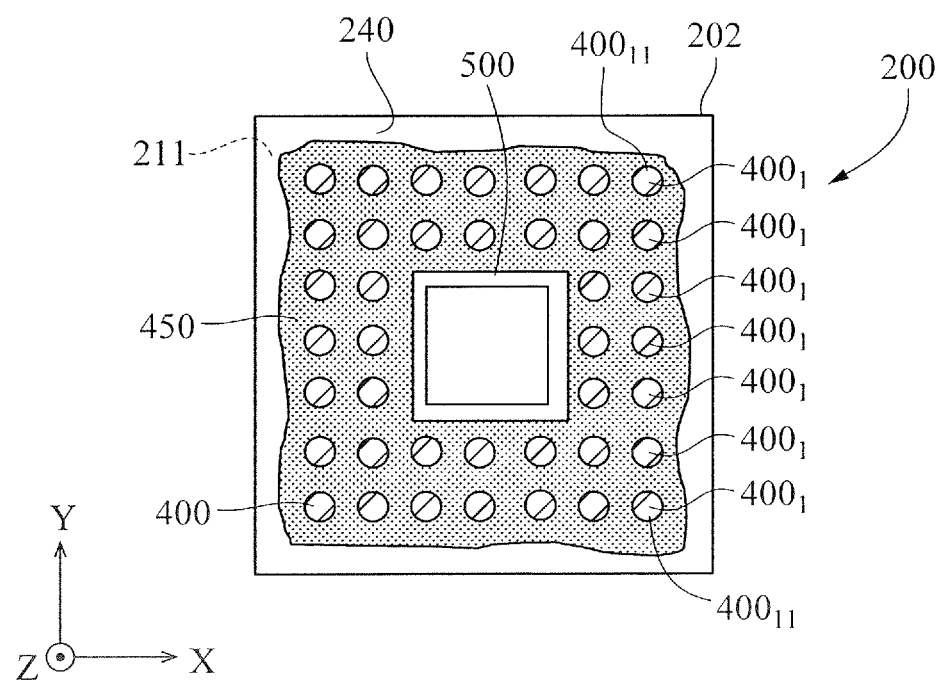
FIG. 6B is a schematic view of the printed wiring board when the printed circuit board according to the first exemplary embodiment is cut in the in-plane direction.

FIG. 6A is a schematic diagram illustrating the image sensor 100 when the printed circuit board 300 illustrated in FIG. 2 is cut in the X-Y direction that is the in-plane direction at the solder bonding portions 400 and the resin portion 450. FIG. 6B is a schematic diagram illustrating the printed wiring board 200 when the printed circuit board 300 illustrated in FIG. 2 is cut in the X-Y direction that is the in-plane direction at the solder bonding portions 400 and the resin portion 450.

As illustrated in FIGS. 6A and 6B, the resin portion 450 cured in a state in which flow of the resin portion 450 to the center side is suppressed by the opening 500 is formed. As illustrated in FIG. 6B, the resin portion 450 is separated from the opening 500 serving as a recess portion. That is, the resin portion 450 is not provided in the opening 500 and in a region enclosed by the opening 500. In this manner, the resin portion 450 is not in contact with a portion defining the recess portion. The resin portion 450 is preferably separated from the entirety of the opening 500. As a result of this, insufficiency of the amount of resin of the resin portion 450 is suppressed around the solder bonding portions 400, particularly around solder bonding portions 4001 positioned in an outer peripheral portion where bonding strength is required among the plurality of solder bonding portions 400. That is, flow of the resin to the center side of the image sensor 100 where no solder bonding portion is provided can be suppressed, and therefore the amount of resin maintained around the solder bonding portions 400, particularly around the solder bonding portions 4001 can be increased. In addition, the amount of maintained resin can be also increased around solder bonding portions 40011 positioned in a corner portion where particularly high bonding strength is required among the solder bonding portions 4001 positioned in the outer peripheral portion.

When the use environment of the digital camera 600, that is, the temperature changes, stress is generated in the solder bonding portions 400 due to difference in linear expansion coefficient between the image sensor 100 and the printed wiring board 200. In addition, when the digital camera 600 is dropped, an impact force is applied to the solder bonding portions 400. In the present exemplary embodiment, since the solder bonding portions 400 are reinforced by the resin portion 450, disconnection of the solder bonding portions 400 can be suppressed even when stress generated by the temperature change or the impact force caused by the dropping is applied, and thus the reliability of the bonding by the solder bonding portions 400 can be improved. Here, examples of the disconnection of the solder bonding portions 400 include breakage of the solder bonding portions 400, peeling of the solder bonding portions 400 from the lands 130, and peeling of the solder bonding portions 400 from the lands 230. Since the reliability of the bonding by the solder bonding portions 400 is increased, electrical and mechanical connection is maintained for a long period. Therefore, the lifetime of the printed circuit board 300 and also the lifetime of the digital camera 600 can be elongated.

By manufacturing the printed circuit board 300 by using the paste P containing a thermosetting resin, solder bonding and formation of underfill can be simultaneously performed by only performing the heating steps S5-1 and S5-2. Therefore, the printed circuit board 300 can be easily manufactured.

Here, it is assumed that the area of the main surface 111 of the image sensor 100 is $S_p$, the total area of the plurality of lands 130 is $S_s$, and the number of the plurality of solder bonding portions 400, that is, the number of terminals is n. In addition, it is assumed that a mixture ratio that is a ratio of a volume $m_1$ of the resin portion 450 to the sum of the volume $m_1$ of the resin portion 450 and a total volume $m_2$ of the plurality of solder bonding portions 400, that is, $m_1/(m_1+m_2)$ is m. Further, it is assumed that the area of the region R2 surrounded by lands 230 on the most inner peripheral side among the plurality of lands 230 is $S_i$, and the area of a region enclosed by the outer periphery of the opening 500 is $S_g$. The outer shape of the opening 500 defined in step S2 illustrated in FIG. 4B preferably has such that the space around the solder bonding portions 400 can be sufficiently filled with the thermosetting resin. That is, the area $S_g$ of the region enclosed by the outer periphery of the opening 500 preferably satisfies Formula (1) below.

$$\min\left(\left|S_p - \frac{S_s}{1-m}\right|, S_i\right) - \frac{4 \cdot S_s}{\sqrt{n}} \leq S_g \leq \min\left(\left|S_p - \frac{S_s}{1-m}\right|, S_i\right) + \frac{4 \cdot S_s}{\sqrt{n}} \quad (1)$$

That is, as a result of the area $S_g$ satisfying Formula (1), the space around the solder bonding portions 400 can be sufficiently filled with the thermosetting resin. Particularly in step S2, it is preferable that the solder resist layer 240 is formed on the main surface 211 such that the minimum distance D between the lands 230 positioned on the most inner peripheral side and the outer periphery of the opening 500 is 0.5 mm to 5.0 mm. More preferably, the minimum distance D is 2.0 mm or smaller. As a result of this, the space around the solder bonding portions 400 can be sufficiently filled with the thermosetting resin.

Modification Example 1

Figure 7A:
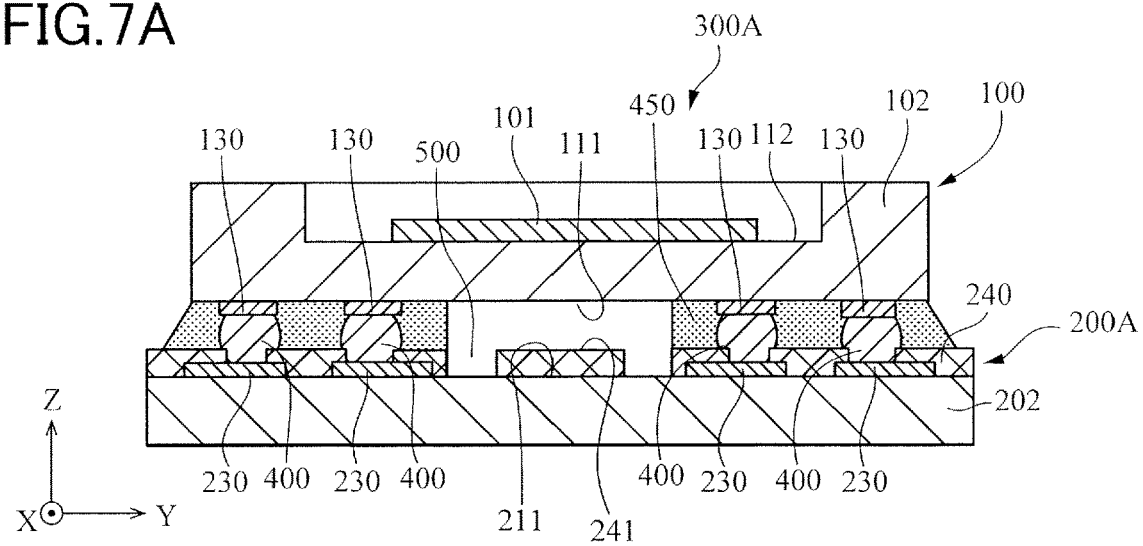
FIG. 7A is a section view of a printed circuit board of Modification Example 1.

FIG. 7A is a section view of a printed circuit board 300A of Modification Example 1. Although a case where the conductor pattern 235 is present at a position corresponding to the opening 500 of the solder resist layer 240 of the printed wiring board 200 has been described in the first exemplary embodiment, the configuration is not limited to this. As illustrated in FIG. 7A, a configuration in which no conductor pattern is present at a position corresponding to the opening 500 and part of the main surface 211 of the insulating substrate 202 serving as a base material of a printed wiring board 200A is exposed through the opening 500 of the solder resist layer 240 may be employed.

Modification Example 2

Figure 7B:
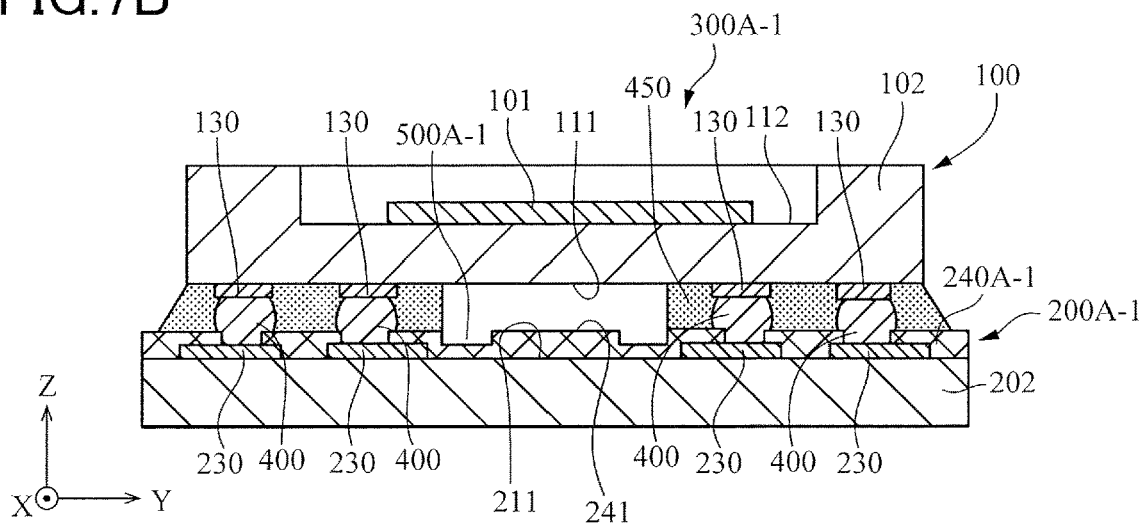
FIG. 7B is a section view of a printed circuit board of Modification Example 2.

FIG. 7B is a section view of a printed circuit board 300A-1 of Modification Example 2. Although a case where the opening 500 of the solder resist layer 240 is a through hole has been described in the first exemplary embodiment, the configuration is not limited to this. As illustrated in FIG. 7B, a printed wiring board 200A-1 includes a solder resist layer 240A-1 provided on the main surface 211 of the insulating substrate 202. In the solder resist layer 240A-1, an opening 500A-1 that is a bottomed hole is defined instead of the opening 500 that is a through hole described in the first exemplary embodiment. It suffices as long as the opening 500A-1 is recessed by 10 μm or more with respect to the adjacent solder resist layer 240A-1.

Modification Example 3

Figure 7C:
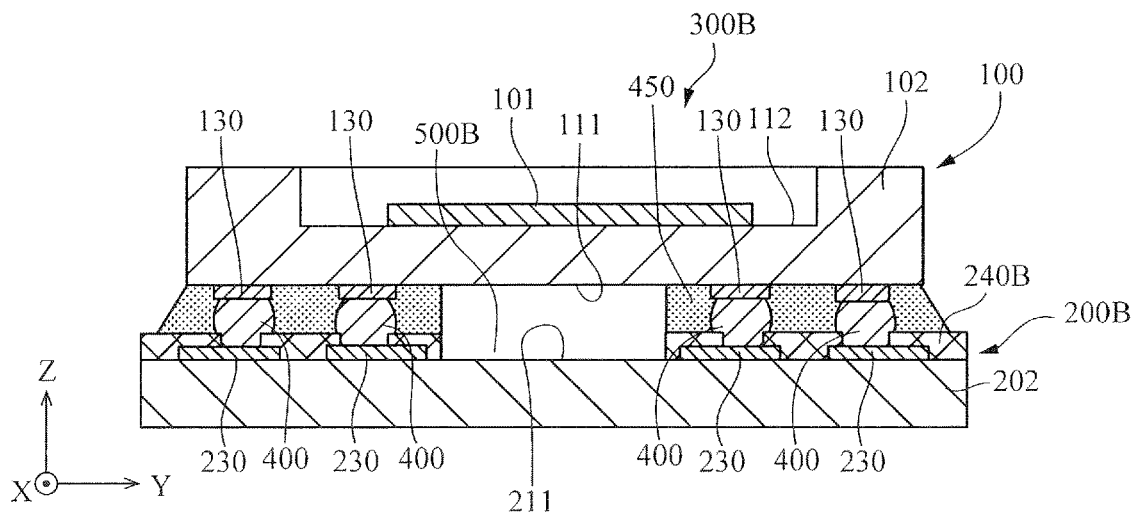
FIG. 7C is a section view of a printed circuit board of Modification Example 3.

FIG. 7C is a section view of a printed circuit board 300B of Modification Example 3. Although a case where the opening 500 has a ring shape has been described in the first exemplary embodiment and Modification Example 1, the configuration is not limited to this. As illustrated in FIG. 7C, a configuration in which no solder resist is present in a region enclosed by the outer periphery of an opening 500B may be employed. In this case, as illustrated in FIG. 7C, no conductor pattern is provided at a position corresponding to the opening 500B, and part of the main surface 211 of the insulating substrate 202 serving as a base material of a printed wiring board 200B may be exposed to the outside through the opening 500B of a solder resist layer 240B. In addition, although the illustration is omitted herein, a conductor pattern may be present at a position corresponding to the opening 500B as in the first exemplary embodiment. In addition, the opening 500B is not limited to a through hole, and may be a bottomed hole as in Modification Example 2.

Modification Example 4

Figure 8A:
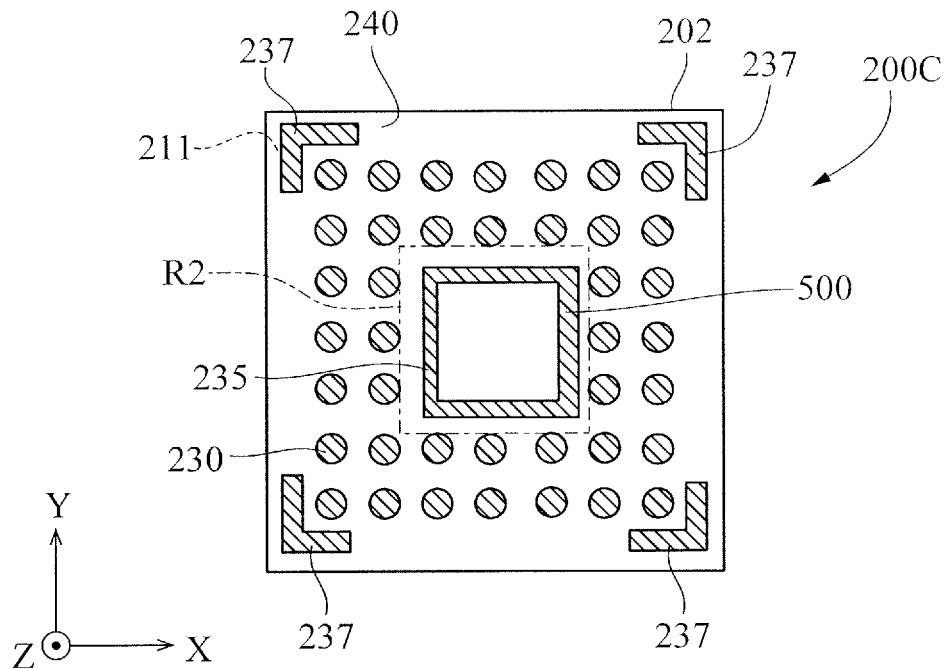
FIG. 8A is a plan view of a printed wiring board of Modification Example 4.

FIG. 8A is a plan view of a printed wiring board 200C of a printed circuit board of Modification Example 4. As illustrated in FIG. 8A, the printed wiring board 200C may further include lands 237 for supplying thermosetting resin in addition to the plurality of lands 230. Although the lands 237 each have an L shape in the example illustrated in FIG. 8A, the shape is not limited to this, and may be an arbitrary shape such as a rectangular shape or a circular shape. In addition, although it is preferable that the lands 237 are disposed in the vicinity of corner portions of the printed wiring board where shortage of thermosetting resin is likely to occur, the configuration is not limited to this, and the lands 237 may be provided at sides of the printed wiring board. By also printing the solder paste containing thermosetting resin on the lands 237, the amount of thermosetting resin between the electronic part and the printed wiring board 200C can be increased.

Modification Example 5

Figure 8B:
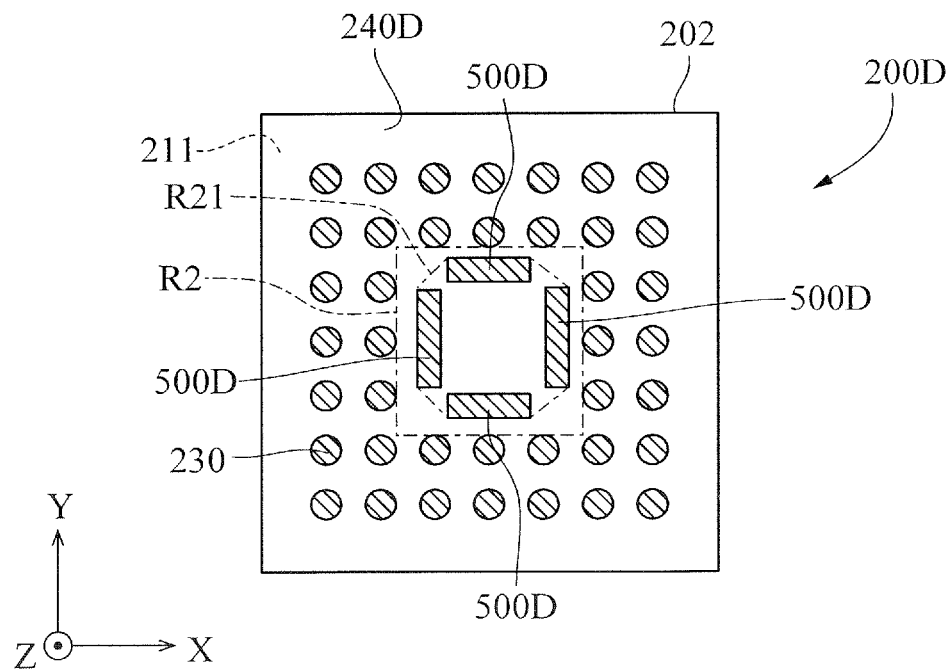
FIG. 8B is a plan view of a printed wiring board of Modification Example 5.

FIG. 8B is a plan view of a printed wiring board 200D of a printed circuit board of Modification Example 5. The number of openings is not limited to one, and a plurality of openings may be provided. A solder resist layer 240D of a printed wiring board 200D illustrated in FIG. 8B includes four openings 500D. Each of the openings 500D is provided at a position corresponding to the region R2, and has an elongated shape extending along the lands 230 on the most inner peripheral side. In this case, the area of a region R21 that is enclosed by envelopes interconnecting the plurality of openings 500D may be used as the area $S_g$ of Formula (1).

Example 1

As Example 1, a case where the printed circuit board 300 illustrated in FIG. 2 was manufactured by the manufacturing method described in the first exemplary embodiment will be described. The image sensor 100 of Example 1 was an LGA package. The area of the bottom surface of the image sensor 100 was 900 $mm^2$, the total area of the lands 130 was 150 $mm^2$, and the number of effective terminals formed from solder was 300. The material of the insulating substrate 102 of the image sensor 100 was alumina ceramics.

The insulating substrate 202 of the printed wiring board 200 was FR-4. The size of the outer shape of the insulating substrate 202 was about 50.0 mm×50.0 mm. The thickness of the solder resist layer 240 was about 0.02 mm. The material of the lands 230 was Cu. The diameter of each land 230 was 1.0 mm, and the lands 230 were arranged in a grid shape at a pitch of 1.6 mm.

Openings through which the lands 230 were exposed were defined in the solder resist layer 240. The area of a region surrounded by the lands on the most inner peripheral side among the plurality of lands 230 was set to 180 $mm^2$, and the area of a region enclosed by the outer periphery of the opening 500 was set to 170 $mm^2$. In addition, the mixture ratio of thermosetting resin in the solder paste was set to 60 vol %. Therefore, the outer shape of the opening 500 satisfied Formula (1).

In step S3 illustrated in FIG. 4C, the paste P was provided on the lands 230 by screen printing. A printing plate having a thickness of 0.02 mm was used for the screen printing. The paste P contained a bisphenol-A epoxy resin as the thermosetting resin, and a curing agent that reacts with the epoxy resin. The alloy composition of the solder powder was a eutectic composition of tin-58 bismuth having a melting point of 139° C., and the average particle diameter thereof was 40 μm. The amount of the solder powder added in the paste P was about 40 vol %, and the remainder includes the thermosetting resin, the curing agent, and a small amount of a flux component for securing a solder bonding property.

In step S4 illustrated in FIG. 5A, the image sensor 100 of an LGA type was mounted, by using a mounter, on the printed wiring board 200 onto which the paste P was supplied. At this time, the lands 130 were positioned so as to oppose the lands 230 of the printed wiring board 200 to which the lands 130 were to be bonded.

Figure 9:
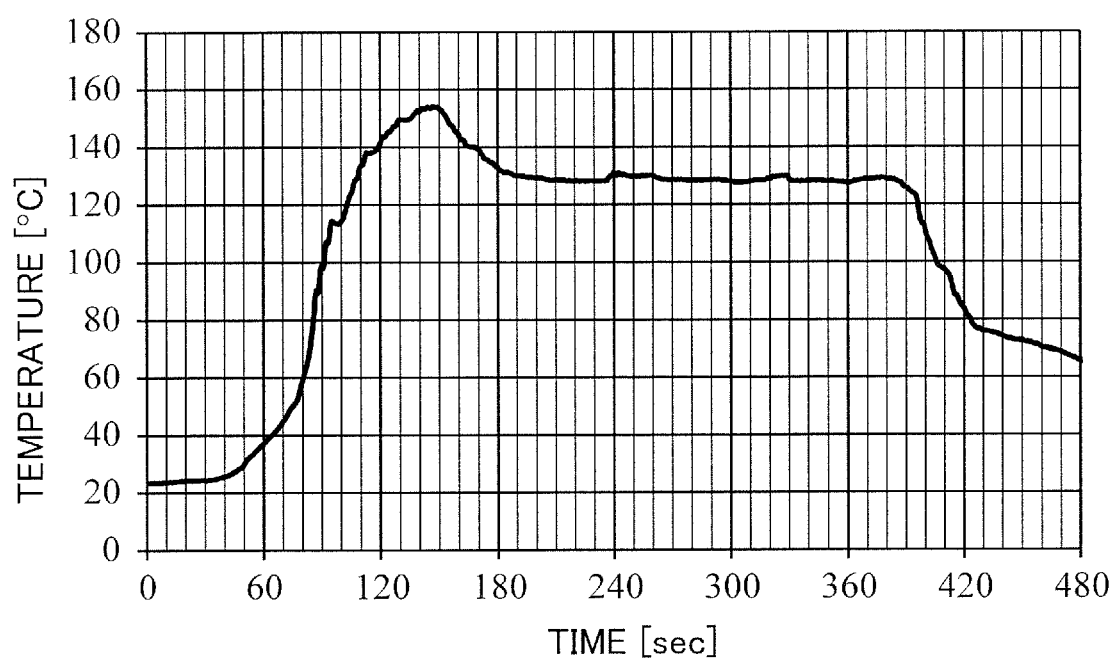
FIG. 9 is a graph of the temperature inside a reflow furnace in Examples.

Next, the paste P illustrated in FIG. 5A was heated in step S5-1 illustrated in FIG. 5B and step S5-2 illustrated in FIG. 5C. The profile of temperature inside the reflow furnace 1000 at this time is illustrated in FIG. 9. FIG. 9 is a graph showing the temperature inside the reflow furnace 1000 in Examples. In step S5-1, as illustrated in FIG. 9, the temperature inside the reflow furnace 1000 was adjusted to a temperature equal to or higher than 139° C., which was the melting point of the solder, and thus the solder in the paste P was melted. As a result of this, the paste P was separated into the molten solder 401 and the thermosetting resin 451.

At this time, the fluidity of the thermosetting resin separated from the solder increased, and thus the thermosetting resin flowed to narrow portions of the gap between the printed wiring board 200 and the image sensor 100 by a capillary phenomenon. Since the opening 500 defined in the solder resist layer 240 was provided at the center portion of the printed wiring board 200 of Example 1, the flow of resin to the center portion was suppressed, and the thermosetting resin 451 was maintained in the vicinity of the solder bonding portion 400.

Then, as illustrated in FIG. 9 in step S5-2, the temperature inside the reflow furnace 1000 was adjusted to a temperature required for thermal curing and lower than 139° C., which was the melting point of solder, and thus the thermosetting resin 451 was cured.

The printed circuit board 300 manufactured by the manufacturing method described above was disassembled into the image sensor 100 and the printed wiring board 200 as illustrated in FIGS. 6A and 6B. The thermosetting resin was observed on each of the image sensor 100 and the printed wiring board 200. It was confirmed that no resin had flowed to the region inside the opening 500 on the printed wiring board 200. In addition, it was confirmed that the resin had not flowed to the outside of the image sensor 100. It was confirmed that all the solder bonding portions 400 were covered by the resin portion 450. According to Example 1, since the solder bonding portions 400 are covered by the resin portion 450, the bonding strength of the printed circuit board 300 is improved.

Comparative Example

Figure 16A:
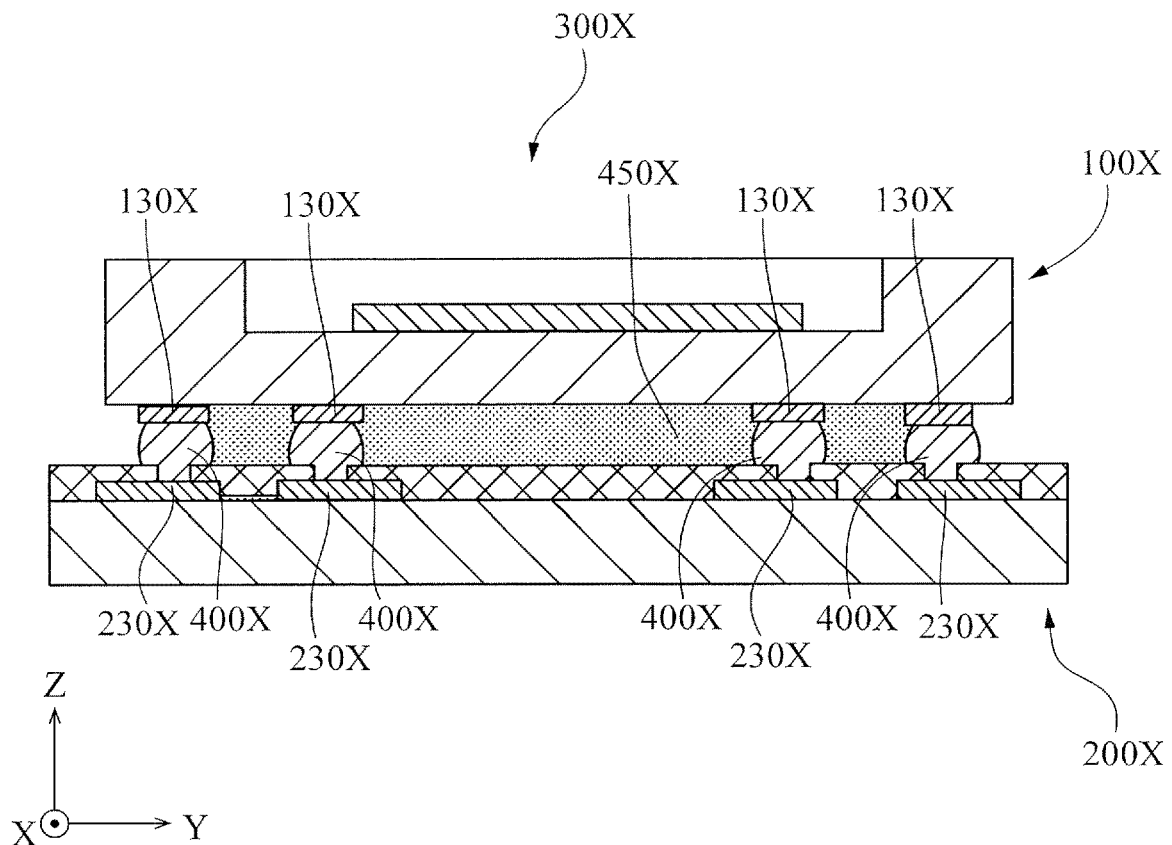
FIG. 16A is a section view of a printed circuit board according to a comparative example.

FIG. 16A is a section view of a printed circuit board 300X of Comparative Example. The printed circuit board 300X does not have the opening 500 as in Examples. In Comparative Example, the printed circuit board 300X was manufactured by performing steps similar to steps S1, S2, S3, S4, S5-1, and S5-2 of Example 1.

In the printed circuit board 300X, lands 130X of an image sensor 100X and lands 230X of a printed wiring board 200X are bonded via solder bonding portions 400X. A resin portion 450X is disposed between the image sensor 100X and the printed wiring board 200X. The resin portion 450X was not present outside of solder bonding portions 400X on the outer periphery. In Comparative Example, movement of uncured thermosetting resin that was fluid could not be controlled, and thus the uncured thermosetting resin flowed out without staying in the vicinity of the solder bonding portions 400X. In the case where the thermosetting resin flows out from the vicinity of the solder bonding portions 400X, the solder bonding portions 400X cannot be sufficiently reinforced.

Figure 16B:
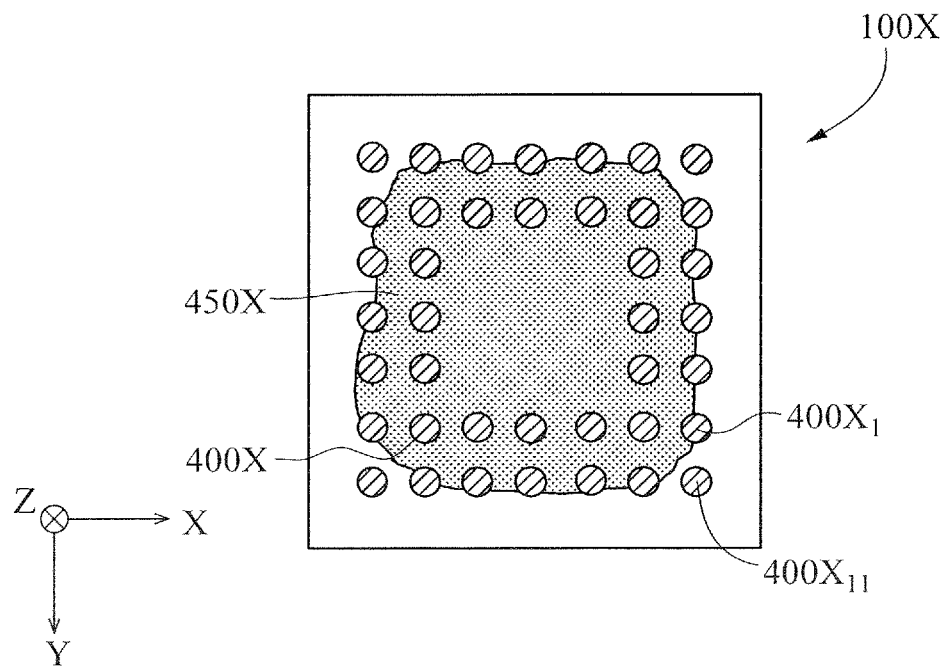
FIG. 16B is a schematic view of an image sensor when the printed circuit board according to the comparative example is cut in the in-plane direction.

FIG. 16B is a schematic view of the image sensor 100X of the printed circuit board 300X of Comparative Example cut in the X-Y direction at the solder bonding portions 400X and the resin portion 450X. The thermosetting resin spread to the center side of the bottom surface of the image sensor 100X, and flowed out from the vicinity of solder bonding portions $400X_1$ positioned on the most outer peripheral side among the plurality of solder bonding portions 400X. The solder bonding portions $400X_1$ were partially or entirely not covered by the resin portion 450X. Particularly, hardly any resin portion 450X was formed around solder bonding portions $400X_{11}$ positioned in the corner portions.

Evaluation of Printed Circuit Board

Inspection of the solder bonding portions was performed by using an X-ray transmission observation apparatus on the printed circuit board of Example 1 manufactured by the manufacturing method described above. As a result, no bonding defect of solder bridges between adjacent solder bonding portions was observed. In addition, no conduction defect was observed in inspection of the solder bonding portions by an electrical test.

In Example 1, step S5-2 for thermally curing the resin was performed at a low temperature of 130° C. lower than the melting point of solder. Therefore, the amount of thermal deformation of the image sensor was small, and sufficient optical performance of the included sensor element was guaranteed.

Next, the image sensor 100 and the printed wiring board 200 were peeled apart, and the state of the solder bonding portions 400 and the resin portion 450 was checked. The solder bonding portions 400 were bonded in a state of being wet-spread on the lands 130 of the image sensor 100 and the lands 230 of the printed wiring board 200, and no trace of the resin portion 450 interrupting the bonding of solder was observed.

The state of the resin portion 450 after peeling was visually observed. The adhesion portion between the solder resist layer 240 and the resin portion 450 was mostly not broken, and peeling occurred between the solder resist layer 240 and the insulating substrate 202. That is, it was confirmed that the thermosetting resin 451 was sufficiently cured, and adhered to the solder resist layer 240 by strong adhesivity.

Second Exemplary Embodiment

Figure 10:
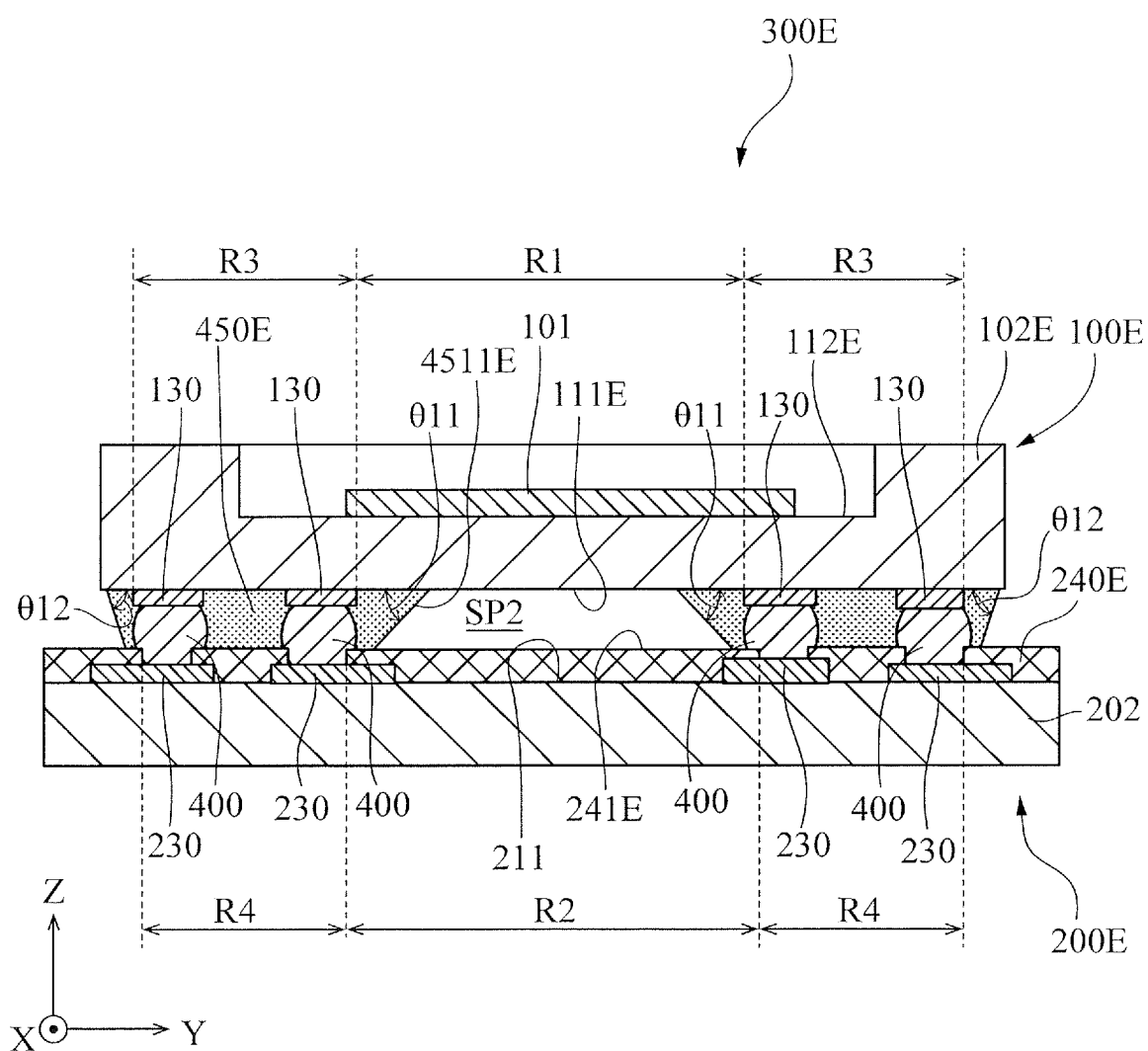
FIG. 10 is a section view of a printed circuit board according to a second exemplary embodiment.

A printed circuit board of a digital camera serving as an example of an electronic device according to a second exemplary embodiment will be described. FIG. 10 is a section view of a printed circuit board 300E according to the second exemplary embodiment. The digital camera of the second exemplary embodiment includes the printed circuit board 300E illustrated in FIG. 10 serving as an example of an electronic module instead of the printed circuit board 300 illustrated in FIG. 1.

As illustrated in FIG. 10, the printed circuit board 300E includes an image sensor 100E serving as an example of an electronic part, and a printed wiring board 200E on which the image sensor 100E is mounted. For example, the image sensor 100E is a CMOS image sensor or a CCD image sensor. The image sensor 100E has a function of converting light incident through the lens unit 602 illustrated in FIG. 1 into an electric signal.

The image sensor 100E is an LGA package. To be noted, the image sensor 100E may be an LCC package. The image sensor 100E includes the sensor element 101 that is a semiconductor element, and an insulating substrate 102E that is a first base portion. The insulating substrate 102E includes a main surface 111E serving as a bottom surface of the image sensor 100E. The image sensor 100E includes the lands 130 serving as a plurality of first lands disposed on the main surface 111E of the insulating substrate 102E. The sensor element 101 is disposed on a surface 112E of the insulating substrate 102E opposite to the main surface 111E. The lands 130 are electrodes formed from conductive metal such as copper. For example, the lands 130 serve as signal electrodes, power electrodes, ground electrodes, or dummy electrodes. An in-plane direction along the main surface 111E will be referred to as an X-Y direction, and an out-of-plane direction perpendicular to the main surface 111E will be referred to as a Z direction.

Figure 11A:
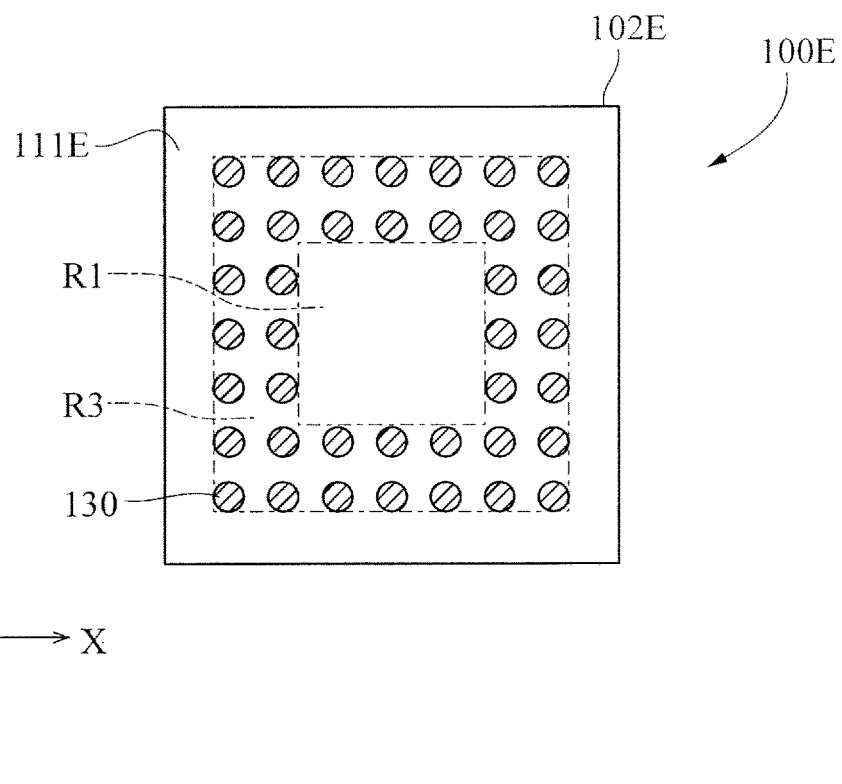
FIG. 11A is a plan view of an image sensor according to the second exemplary embodiment.

FIG. 11A is a plan view of the image sensor 100E as viewed from the main surface 111E side. The lands 130 each have a circular shape in the plan view, but the shape is not limited to this. The lands 130 each may have a polygonal shape or a + shape in the plan view. The insulating substrate 102E is formed from, for example, ceramics such as alumina.

As illustrated in FIG. 10, the printed wiring board 200E includes the insulating substrate 202 serving as a second base portion similarly to the first exemplary embodiment. The insulating substrate 202 includes the main surface 211 serving as a main surface of the printed wiring board 200E. The printed wiring board 200E includes the lands 230 serving as a plurality of second lands disposed on the main surface 211 of the insulating substrate 202. The lands 230 are electrodes formed from conductive metal such as copper. For example, the lands 230 serve as signal electrodes, power electrodes, ground electrodes, or dummy electrodes. The insulating substrate 202 is formed from an insulating material such as epoxy resin.

Figure 11B:
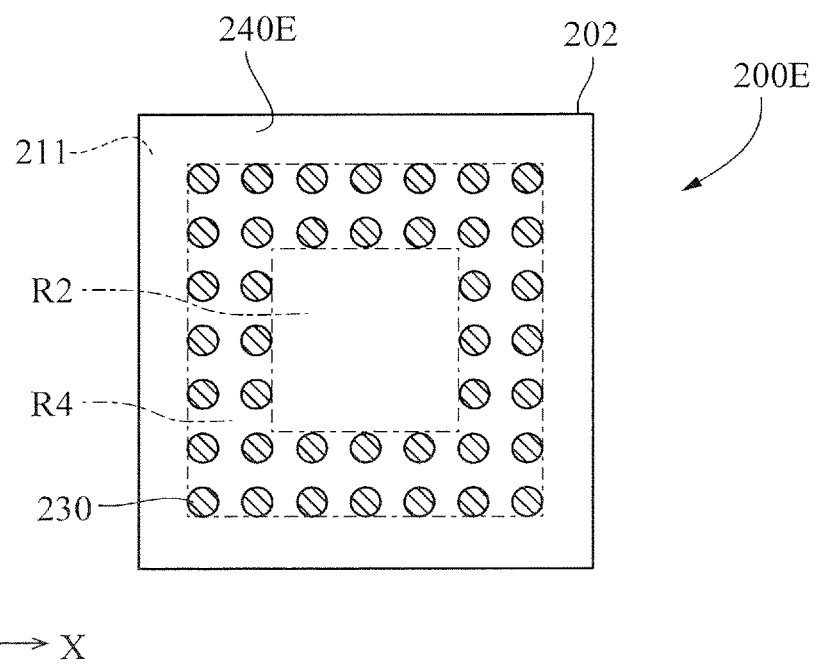
FIG. 11B is a plan view of a printed wiring board according to the second exemplary embodiment.

The printed wiring board 200E includes a solder resist layer 240E that is a film of a solder resist. The solder resist layer 240E is provided on the main surface 211. In the present exemplary embodiment, the lands 230 are SMD lands. To be noted, the lands 230 may be NSMD lands. FIG. 11B is a plan view of the printed wiring board 200E as viewed from the main surface 211 side. The lands 230 each have a circular shape in the plan view, but the shape is not limited to this. The lands 230 each may have a polygonal shape or a + shape in the plan view.

As illustrated in FIG. 10, the plurality of lands 130 are respectively bonded to the plurality of lands 230 via the plurality of solder bonding portions 400 containing solder. In each of the solder bonding portions 400, part not in contact with the lands 130 and 230 and the solder resist layer 240E is covered by a resin portion 450E that is an underfill.

The resin portion 450E mainly contains a cured product that is a resin material obtained by thermally curing a thermosetting resin. In the present exemplary embodiment, the plurality of solder bonding portions 400 are covered by a single body of the resin portion 450E. To be noted, although the plurality of solder bonding portions 400 are preferably covered by a single body of the resin portion 450E, the configuration is not limited to this, and the plurality of solder bonding portions 400 may be covered by a plurality of separate resin portions.

As illustrated in FIG. 11A, the main surface 111E includes the region R1 serving as a first region and the region R3 serving as a third region surrounding the region R1. The plurality of lands 130 are arranged in the region R3 with intervals therebetween. The region R1 is a rectangular region of the maximum size among a region surrounded by lands 130 positioned on the most inner peripheral side among the plurality of lands 130. The region R1 is a region including the center of the main surface 111E. As illustrated in FIG. 11B, the main surface 211 includes the region R2 serving as a second region and the region R4 serving as a fourth region surrounding the region R2. The plurality of lands 230 are arranged in the region R4 with intervals therebetween. The region R2 is a rectangular region of the maximum size among a region surrounded by lands 230 positioned on the most inner peripheral side among the plurality of lands 230. The lands 230 are respectively disposed at positions opposing the lands 130.

The region R1 and the region R2 oppose each other. The region R3 and the region R4 oppose each other. The resin portion 450E is in contact with the main surface 111E of the insulating substrate 102E serving as a bottom surface of the image sensor 100E at an acute angle. Specifically, the resin portion 450E is in contact with the region R1 of the main surface 111E at an acute angle. In FIG. 10, the angle of a portion 4511E where the resin portion 450E is in contact with the region R1 of the image sensor 100E is θ11. The portion 4511E is an inner side portion of the resin portion 450E. In addition, the angle of an outer side portion of the resin portion 450E is θ12. In the present exemplary embodiment, the angles θ11 and θ12 are both acute angles.

As a result of controlling the flow of the liquid thermosetting resin before curing, the angles θ11 and θ12 of the resin portion 450E after curing become acute angles, and as illustrated in FIG. 10, the gap between the regions R3 and R4 is filled with the resin portion 450E. The resin portion 450E is in contact with the plurality of solder bonding portions 400. A space SP2 where the resin portion 450E is not present is defined between the regions R1 and R2 by the resin portion 450E.

The adhesivity between the resin portion 450E and the insulating substrate 102E per unit area is lower than the adhesivity between the resin portion 450E and the solder resist layer 240E per unit area. By setting the angles θ11 and θ12 to acute angles, particularly the angle θ11 to an acute angle, the contact area between the resin portion 450E and the insulating substrate 102E can be secured while defining the space SP2. As a result of this, concentration of stress on the contact interface between the resin portion 450E and the insulating substrate 102E can be suppressed, peeling between the resin portion 450E and the insulating substrate 102E can be suppressed, and stress applied to the solder bonding portions 400 can be reduced. To make the angles θ11 and θ12 acute angles, especially the angle θ11 an acute angle, in the present exemplary embodiment, such an insulating substrate 102E that a contact angle of the liquid thermosetting resin with respect to the main surface 111E of the image sensor 100E is an acute angle is used. Specifically, by controlling the contact angle of the liquid thermosetting resin by changing, for example, the surface roughness of the main surface 111E of the insulating substrate 102E that is a surface of the image sensor 100E and/or the material of the insulating substrate 102E, the angles θ11 and θ12 are set to acute angles. Setting the angles θ11 and θ12 of the cured resin portion 450E by controlling the contact angle of the liquid thermosetting resin with respect to the image sensor 100E by changing the surface roughness of the image sensor 100E is preferable for the ease of manufacture. In addition, to make the liquid thermosetting resin be easily wet-spread, that is, make the contact angle be likely to be an acute angle, the surface roughness of the main surface 111E of the insulating substrate 102E on which the resin portion 450E comes into contact with the image sensor 100E is preferably 100 nm or larger. In addition, the surface roughness of the main surface 111E of the insulating substrate 102E is preferably 500 nm or smaller such that the liquid thermosetting resin does not wet-spread too much. The surface roughness of the main surface 111E is arithmetic mean roughness. In the case where the surface roughness of the main surface 111E of the insulating substrate 102E is 100 nm to 500 nm, the resin that wet-spreads in the region surrounded by the plurality of lands 130 wet-spreads further on the inside by about 1 mm than the resin that wet-spreads in the region surrounded by the plurality of lands 230. As a result of this, the resin wet-spreading too much on the main surface 111E can be suppressed, and insufficiency of resin around the solder bonding portions 400 on the most outer peripheral side among the plurality of solder bonding portions 400 can be also suppressed.

A manufacturing method for the printed circuit board 300E will be described. FIGS. 12A, 12B, 12C, 13A, 13B, and 13C are each an explanatory diagram of each step of the method for manufacturing the printed circuit board 300E illustrated in FIG. 10.

Figure 12A:
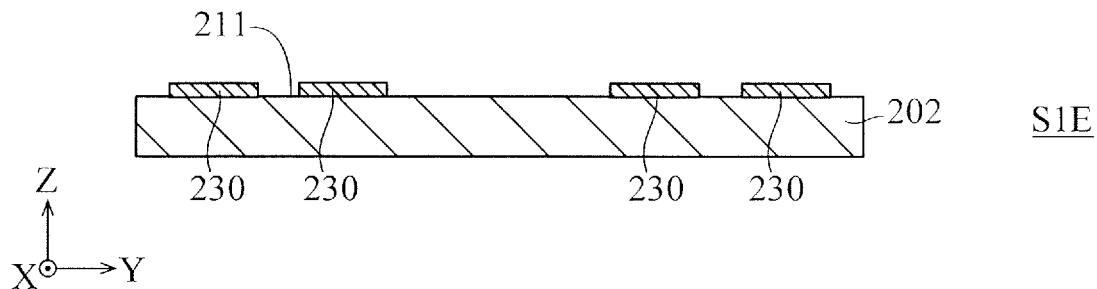
FIG. 12A is an explanatory diagram of a method for manufacturing the printed circuit board according to the second exemplary embodiment.
Figure 12B:
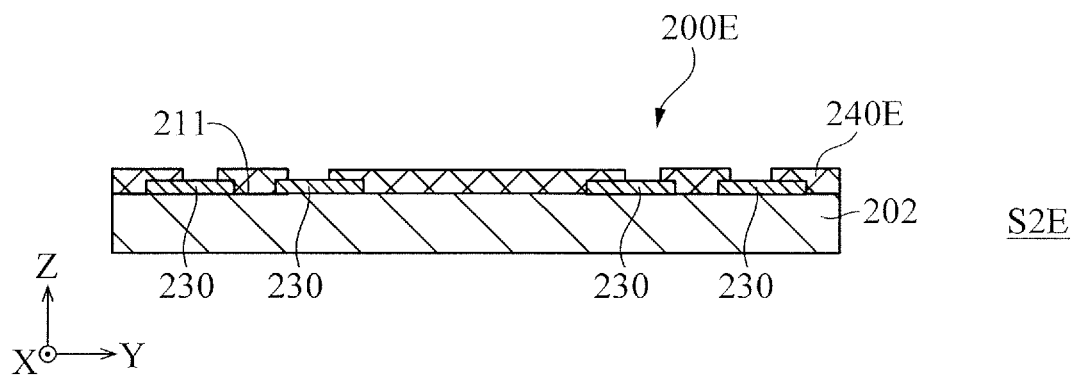
FIG. 12B is an explanatory diagram of the method for manufacturing the printed circuit board according to the second exemplary embodiment.

As illustrated in FIG. 12A, the insulating substrate 202 on which the lands 230 are provided is prepared in step S1E. Next, the solder resist layer 240E is formed on one or both of the main surfaces 111E and 211 in step S2E. In the present exemplary embodiment, the solder resist layer 240E is formed on the main surface 211 in step S2E. In this step S2E, openings through which the lands 230 are exposed is defined at a position corresponding to the lands 230 in the solder resist layer 240E. The printed wiring board 200E is prepared by manufacturing the printed wiring board 200E through steps S1E and S2E described above. In addition, the image sensor 100E manufactured by a different manufacturing process is prepared.

Figure 12C:
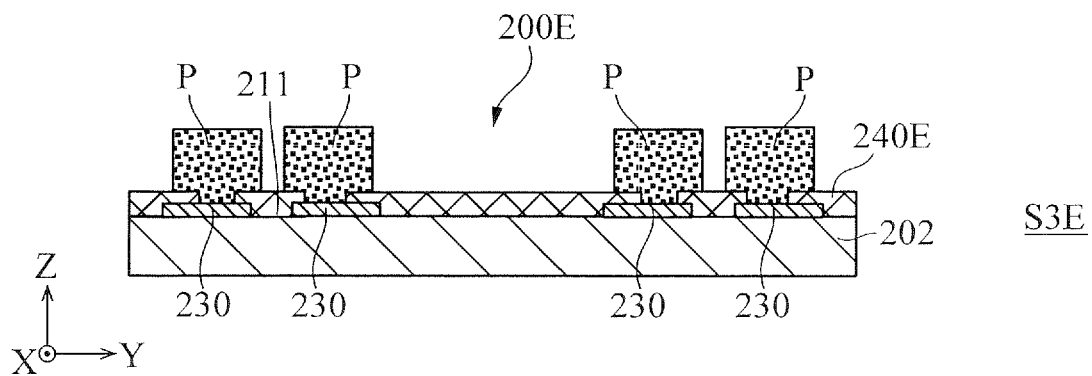
FIG. 12C is an explanatory diagram of the method for manufacturing the printed circuit board according to the second exemplary embodiment.

Next, the paste P is disposed on each of the plurality of lands 230 in step S3E as illustrated in FIG. 12C. The paste P contains solder powder and an uncured thermosetting resin. The thermosetting resin is preferably a thermosetting epoxy resin, and is particularly preferably bisphenol-A epoxy resin. The paste P may further contain a flux component required for soldering.

In step S3E, the paste P is supplied to the printed wiring board 200E by screen printing or using a dispenser. To be noted, the paste P may be supplied to cover the entirety of each of the lands 230 as illustrated in FIG. 12C, or, although the illustration thereof is omitted herein, the paste P may be supplied to partially cover each of the lands 230.

Figure 13A:
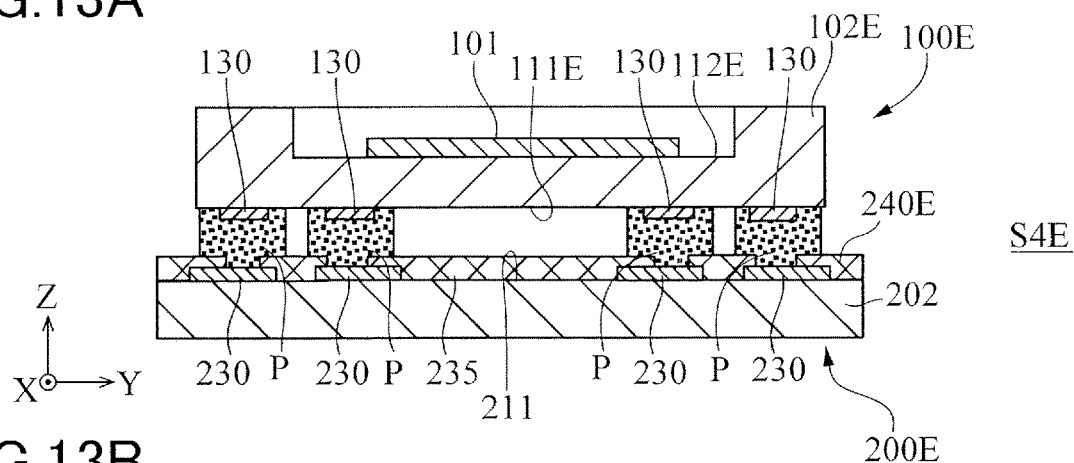
FIG. 13A is an explanatory diagram of the method for manufacturing the printed circuit board according to the second exemplary embodiment.

Next, as illustrated in FIG. 13A, the image sensor 100E is mounted on the printed wiring board 200E such that the paste P is sandwiched between the lands 130 and the lands 230 in step S4E. In the present exemplary embodiment, in step S4E, the image sensor 100E is mounted on the printed wiring board 200E by using an unillustrated mounter. At this time, the image sensor 100E is positioned and mounted on the printed wiring board 200E such that the lands 130 oppose the lands 230.

Figure 13B:
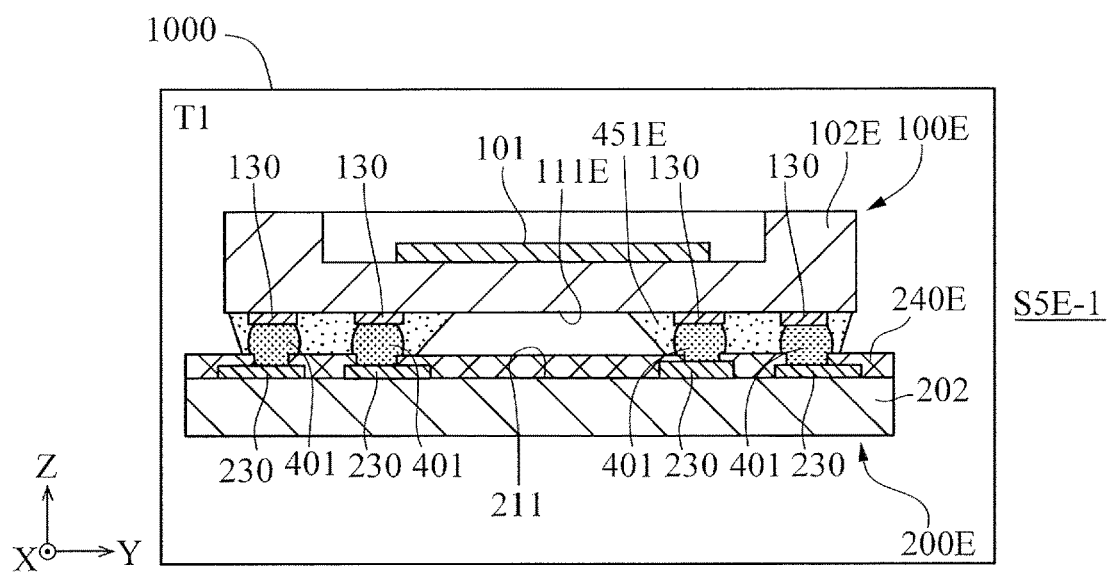
FIG. 13B is an explanatory diagram of the method for manufacturing the printed circuit board according to the second exemplary embodiment.

Next, as illustrated in FIG. 13B, the printed wiring board 200E on which the image sensor 100E is mounted is conveyed to the reflow furnace 1000. Then, in step S5E-1 illustrated in FIG. 13B and step S5E-2 illustrated in FIG. 13C, the paste P is heated while adjusting the heating temperature in the reflow furnace 1000 and thus the image sensor 100E and the printed wiring board 200E are bonded via solder.

First, step S5E-1 illustrated in FIG. 13B will be described. In step S5E-1, the temperature inside the reflow furnace 1000 is adjusted to the first temperature T1 equal to or higher than the melting point of the solder powder contained in the paste P. As a result of this, the solder powder in the paste P melts, and thus the paste P separates into the molten solder 401 and uncured thermosetting resin 451E. Specifically, the thermosetting resin 451E moves to the vicinity of the molten solder 401. Although the first temperature T1 is preferably constant over time, the first temperature T1 may change over time.

Figure 13C:
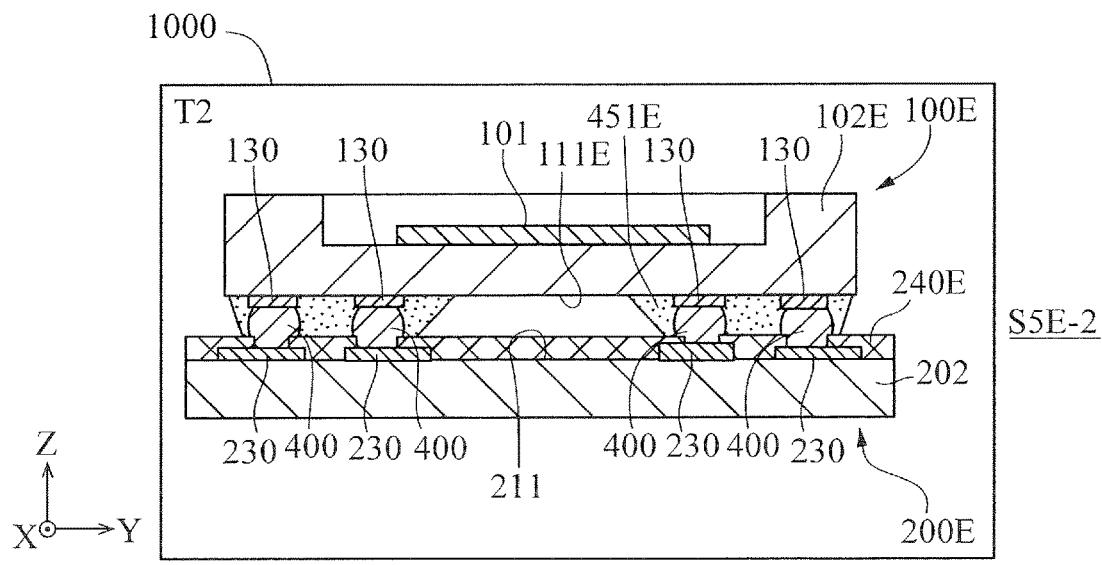
FIG. 13C is an explanatory diagram of the method for manufacturing the printed circuit board according to the second exemplary embodiment.

Then, in step S5E-2 illustrated in FIG. 13C, the temperature inside the reflow furnace 1000 is adjusted to the second temperature T2 lower than the melting point of the solder, and thus the molten solder 401 is solidified. That is, T2<T1 holds. As a result of this, the solder bonding portions 400 bonding the lands 130 to the lands 230 are formed. The printed circuit board 300E manufactured in this manner is provided in the casing 611 illustrated in FIG. 1.

The second temperature T2 is also a temperature at which the thermosetting resin 451E is cured, and the temperature inside the reflow furnace 1000 is kept at the second temperature T2 for a period equal to or longer than a predetermined time required for the thermosetting resin 451E to be cured. As a result of this, the thermosetting resin 451E is gradually cured, and thus the resin portion 450E illustrated in FIG. 10 is formed. Although the second temperature T2 is preferably constant over time, the second temperature T2 may change over time.

The solder bonding portions 400, more specifically contact portions between the solder bonding portions 400 and the lands 130 and contact portions between the solder bonding portions 400 and the lands 230 are reinforced by the resin portion 450E illustrated in FIG. 10, and thus the reliability of bonding by the solder bonding portions 400 is improved.

To be noted, although a case where step S5E-1 illustrated in FIG. 13B and step S5E-2 illustrated in FIG. 13C are continuously performed in the same reflow furnace 1000 has been described, the configuration is not limited to this. In the case where the size of the reflow furnace 1000 is small and sufficient time for step S5E-2 cannot be secured, an intermediate product may be moved to an unillustrated heating furnace after the heating in the reflow furnace 1000 of step S5E-1, and then the thermosetting resin 451E may be heated to the second temperature T2 to cure.

In step S5E-1, the paste P separates into the molten solder 401 in which solder is aggregated and the uncured thermosetting resin 451E flowing around the molten solder 401. At this time, the surface area of the uncured thermosetting resin 451E is smaller than in the paste state, and thus the viscosity thereof apparently decreases and the fluidity thereof increases.

The thermosetting resin 451E whose fluidity has increased wet-spreads on the main surface 111E serving as the bottom surface of the image sensor 100E while forming a shape of a contact angle. In the present exemplary embodiment, the surface roughness of the main surface 111E serving as the bottom surface of the image sensor 100E is larger than the surface roughness of the surface 241E of the solder resist layer 240E provided on the main surface 211 of the printed wiring board 200E. Since resin is more likely to wet-spread on a surface of larger surface roughness, the thermosetting resin 451E wet-spreads in a wider region on the main surface 111E, which has larger surface roughness than the surface 241E of the solder resist layer 240E, than on the surface 241E. As a result, the thermosetting resin 451E forms a resin shape of an acute angle with respect to the main surface 111E of the image sensor 100E. Therefore, a shape corresponding to the contact angle can be formed regardless of the warpage state of the image sensor 100E and the printed wiring board 200E. That is, the resin portion 450E is in contact with the main surface 111E of the image sensor 100E at an acute angle. Therefore, stress becomes less likely to be concentrated on the contact interface between the main surface 111E serving as the bottom surface of the image sensor 100E and the resin portion 450E formed from the thermosetting resin, and thus stress applied to the solder bonding portions 400 can be reduced. As a result of this, the strength and reliability of bonding by the solder bonding portions 400 are improved. In addition, in the case where the surface roughness of the main surface 111E of the insulating substrate 102E is 100 nm to 500 nm, the resin that wet-spreads in the region surrounded by the plurality of lands 130 wet-spreads further on the inside by about 1 mm than the resin that wet-spreads in the region surrounded by the plurality of lands 230. As a result of this, the resin wet-spreading too much on the main surface 111E can be suppressed, and insufficiency of resin around the solder bonding portions 400 positioned on the most outer peripheral side among the plurality of solder bonding portions 400 can be also suppressed.

Figure 14A:
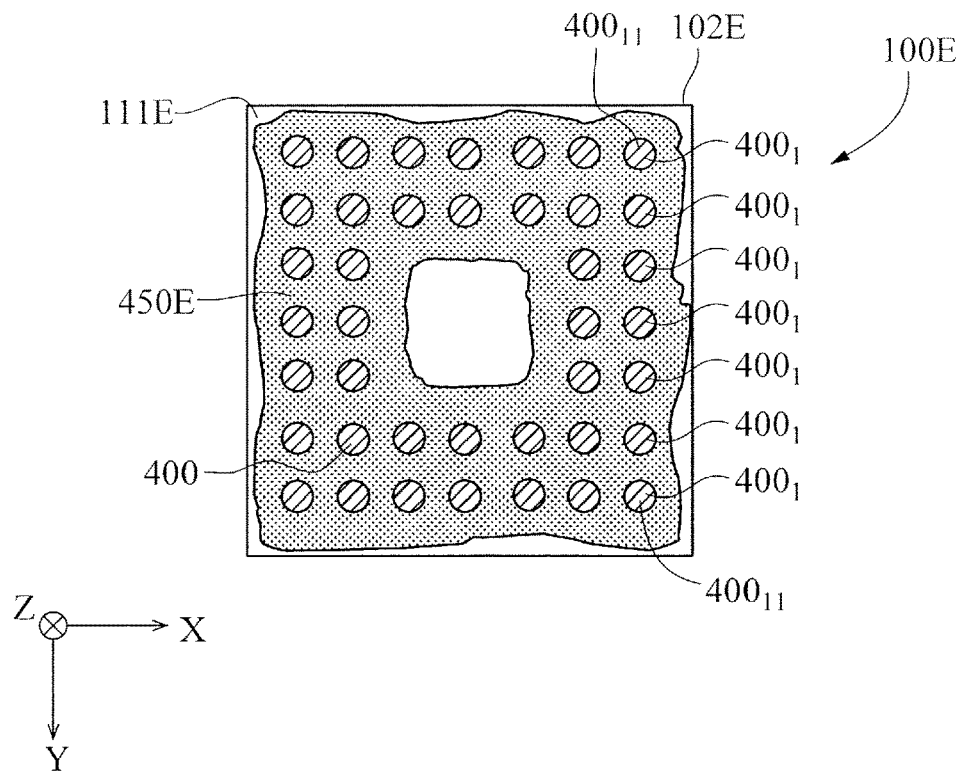
FIG. 14A is a schematic view of the image sensor when the printed circuit board according to the second exemplary embodiment is cut in the in-plane direction.
Figure 14B:
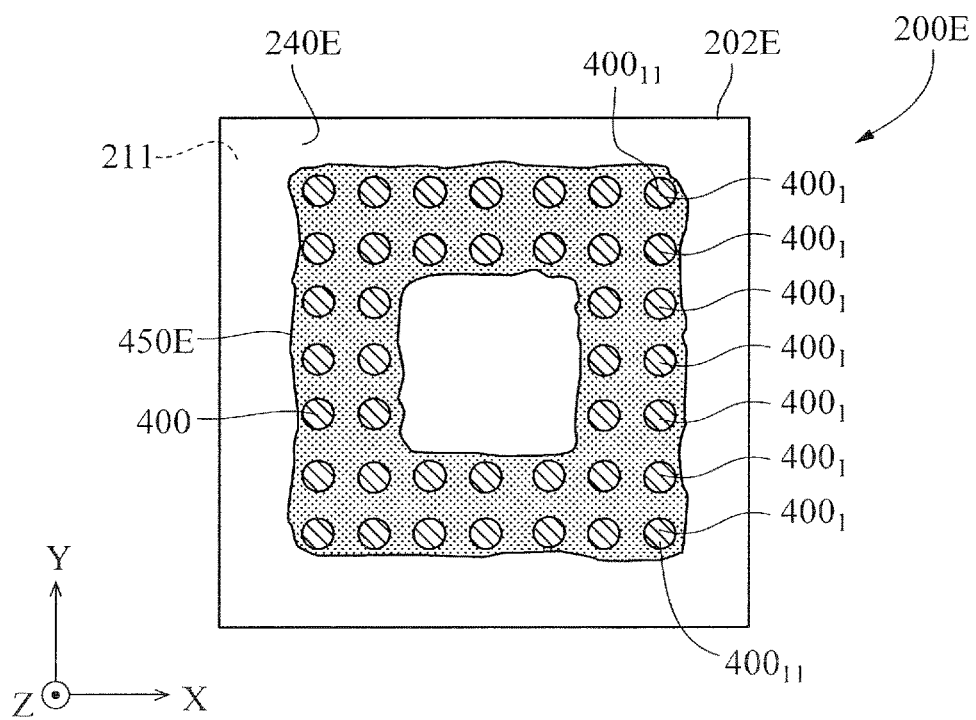
FIG. 14B is a schematic view of the printed wiring board when the printed circuit board according to the second exemplary embodiment is cut in the in-plane direction.

FIG. 14A is a schematic diagram illustrating the image sensor 100E when the printed circuit board 300E illustrated in FIG. 2 is cut in the X-Y direction that is the in-plane direction at the solder bonding portions 400 and the resin portion 450E. FIG. 14B is a schematic diagram illustrating the printed wiring board 200E when the printed circuit board 300E is cut in the X-Y direction that is the in-plane direction at the solder bonding portions 400 and the resin portion 450E.

As illustrated in FIGS. 14A and 14B, the resin portion 450E cured in a state in which flow of the resin portion 450E to the center side is suppressed are formed. As a result of this, insufficiency of the amount of resin of the resin portion 450E is suppressed around the solder bonding portions 400, particularly around the solder bonding portions 4001 positioned in an outer peripheral portion where bonding strength is required among the plurality of solder bonding portions 400. That is, flow of the resin to the center side of the image sensor 100E where no solder bonding portion is provided can be suppressed, and therefore the amount of resin maintained around the solder bonding portions 400, particularly around the solder bonding portions 4001 can be increased. In addition, the amount of maintained resin can be also increased around the solder bonding portions 40011 positioned in a corner portion where particularly high bonding strength is required among the solder bonding portions 4001 positioned in the outer peripheral portion.

When the use environment of the digital camera, that is, the temperature changes, stress is generated in the solder bonding portions 400 due to difference in linear expansion coefficient between the image sensor 100E and the printed wiring board 200E. In addition, when the digital camera is dropped, an impact force is applied to the solder bonding portions 400. In the present exemplary embodiment, since the solder bonding portions 400 are reinforced by the resin portion 450E, disconnection of the solder bonding portions 400 can be suppressed even when stress generated by the temperature change or the impact force caused by the dropping is applied. Here, examples of the disconnection of the solder bonding portions 400 include breakage of the solder bonding portions 400, peeling of the solder bonding portions 400 from the lands 130, and peeling of the solder bonding portions 400 from the lands 230. The reliability of the bonding by the solder bonding portions 400 is increased, and electrical and mechanical connection is maintained for a long period. Therefore, the lifetime of the printed circuit board 300E, and also the lifetime of the digital camera can be elongated.

By manufacturing the printed circuit board 300E by using the paste P containing a thermosetting resin, solder bonding and formation of underfill can be simultaneously performed by only performing the heating steps S5E-1 and S5E-2. Therefore, the printed circuit board 300E can be easily manufactured.

Third Exemplary Embodiment

Figure 15A:
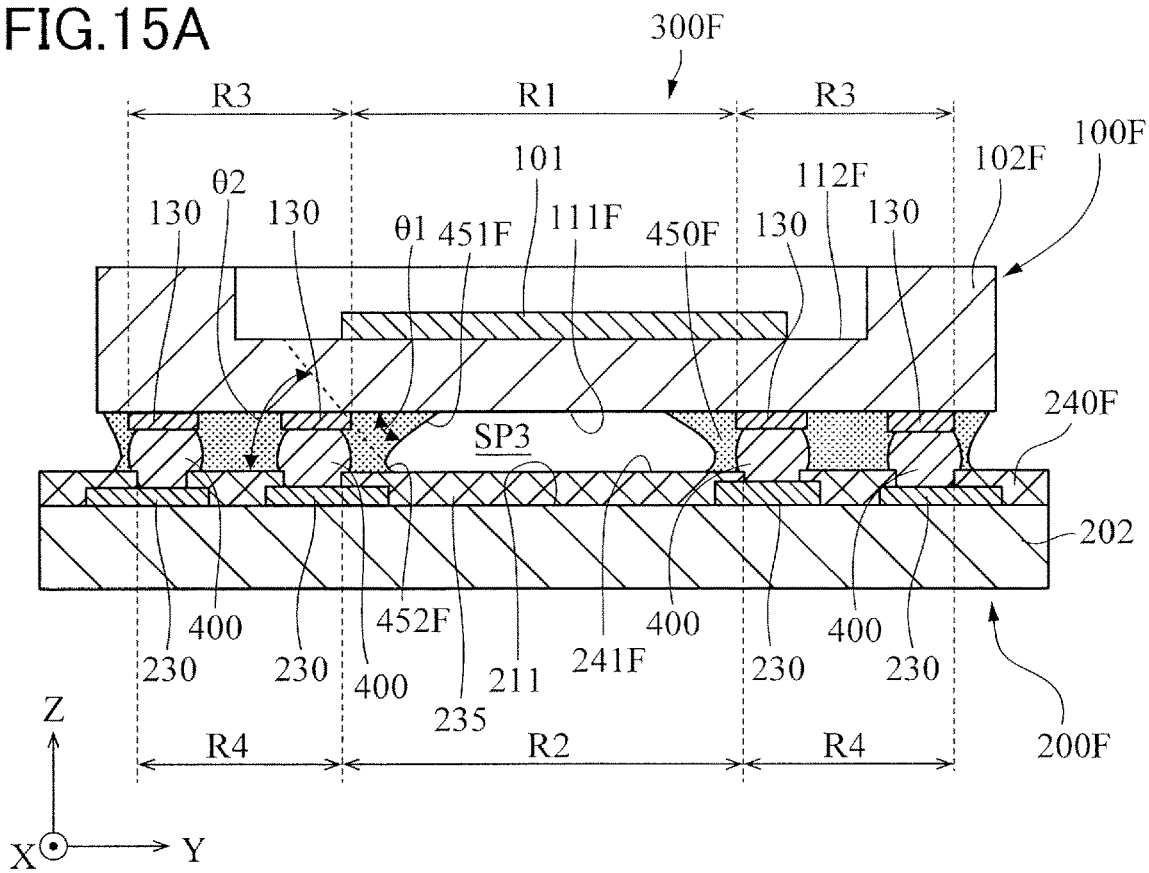
FIG. 15A is a section view of a printed circuit board according to a third exemplary embodiment.

A printed circuit board of a digital camera serving as an example of an electronic device according to a third exemplary embodiment will be described. FIG. 15A is a section view of a printed circuit board 300F according to the third exemplary embodiment. The digital camera of the third exemplary embodiment includes the printed circuit board 300F illustrated in FIG. 15A serving as an example of an electronic module instead of the printed circuit board 300 illustrated in FIG. 1.

As illustrated in FIG. 15A, the printed circuit board 300F includes an image sensor 100F serving as an example of an electronic part, and a printed wiring board 200F on which the image sensor 100F is mounted. For example, the image sensor 100F is a CMOS image sensor or a CCD image sensor. The image sensor 100F has a function of converting light incident through the lens unit 602 illustrated in FIG. 1 into an electric signal.

The image sensor 100F is an LGA package. To be noted, the image sensor 100F may be an LCC package. The image sensor 100F includes the sensor element 101 that is a semiconductor element, and an insulating substrate 102F that is a first base portion. The insulating substrate 102F includes a main surface 111F serving as a bottom surface of the image sensor 100F. The image sensor 100F includes the lands 130 serving as a plurality of first lands disposed on the main surface 111F. The sensor element 101 is disposed on a surface 112F of the insulating substrate 102F opposite to the main surface 111F. The lands 130 are electrodes formed from conductive metal such as copper. For example, the lands 130 serve as signal electrodes, power electrodes, ground electrodes, or dummy electrodes. An in-plane direction along the main surface 111F will be referred to as an X-Y direction, and an out-of-plane direction perpendicular to the main surface 111F will be referred to as a Z direction.

Similarly to the first exemplary embodiment, the printed wiring board 200F includes the insulating substrate 202 that is a second base portion and the lands 230 serving as a plurality of second lands disposed on the main surface 211 of the insulating substrate 202. The lands 230 are electrodes formed from conductive metal such as copper. For example, the lands 230 serve as signal electrodes, power electrodes, ground electrodes, or dummy electrodes. The insulating substrate 202 is formed from an insulating material such as epoxy resin.

A solder resist layer 240F constituted by a film of solder resist is provided on the main surface 211. In the present exemplary embodiment, the lands 230 are SMD lands, but may be NSMD lands.

The plurality of lands 130 are respectively bonded to the plurality of lands 230 via the plurality of solder bonding portions 400 containing solder. In each of the solder bonding portions 400, part not in contact with the lands 130 and 230 and the solder resist layer 240F is covered by a resin portion 450F that is an underfill. The resin portion 450F mainly contains a cured product that is a resin material obtained by thermally curing a thermosetting resin. In the present exemplary embodiment, the plurality of solder bonding portions 400 are covered by a single body of the resin portion 450F. To be noted, although the plurality of solder bonding portions 400 are preferably covered by a single body of the resin portion 450F, the configuration is not limited to this, and the plurality of solder bonding portions 400 may be covered by a plurality of separate resin portions.

The resin portion 450F is in contact with the main surface 111F of the insulating substrate 102F serving as the surface of the image sensor 100F at an acute angle. Particularly, the resin portion 450F is in contact with the surface of the image sensor 100F in the region R1, that is, on part of the main surface 111F in the region R1 at an acute angle. In FIG. 15A, an angle of a portion 451F serving as a first portion where the resin portion 450F is in contact with the region R1 of the image sensor 100F is θ1. In the present exemplary embodiment, the angle 91 is an acute angle. The portion 451F is an inner side portion of the resin portion 450F.

Further, the resin portion 450F is in contact with the surface 241F of the solder resist layer 240F serving as a surface of the printed wiring board 200F at an acute angle. Particularly, the resin portion 450F is in contact with part of the surface 241F of the solder resist layer 240F in the region R2 at an acute angle. In FIG. 15A, an angle of a portion 452F serving as a second portion where the resin portion 450F is in contact with the part of the surface 241F in the region R2 of the image is θ2. The portion 452F is an inner side portion of the resin portion 450F. In the present exemplary embodiment, the angle 92 is an acute angle.

As a result of controlling the flow of the liquid thermosetting resin before curing, the angles θ1 and θ2 of the resin portion 450F after curing become acute angles, and as illustrated in FIG. 15A, the gap between the regions R3 and R4 is filled with the resin portion 450F. The resin portion 450F is in contact with the plurality of solder bonding portions 400. A space SP3 where the resin portion 450F is not present are defined between the regions R1 and R2 by the resin portion 450F.

To make the angle θ1 an acute angle, in the present exemplary embodiment, such an insulating substrate 102F that the contact angle of the liquid thermosetting is an acute angle is used. In addition, to make the angle 92 an acute angle, in the present exemplary embodiment, such a solder resist layer 240F that the contact angle of the liquid thermosetting is an acute angle is used.

Since the contact angle of the liquid thermosetting resin is an acute angle with respect to both of the image sensor 100F and the printed wiring board 200F, the resin shape on the image sensor 100F side and the resin shape on the printed wiring board 200F side both have acute angles. Since the resin portion 450F is in contact with the image sensor 100F at an acute angle, stress becomes less likely to be concentrated on the contact interface between the main surface 111F serving as the bottom surface of the image sensor 100F and the resin portion 450F formed from the thermosetting resin, and thus stress applied to the solder bonding portions 400 can be reduced. In addition, since the resin portion 450F is in contact with the printed wiring board 200F at an acute angle, stress becomes less likely to be concentrated on the contact interface between surface 241F serving as a mounting surface of the printed wiring board 200F and the resin portion 450F formed from the thermosetting resin, and thus stress applied to the solder bonding portions 400 can be reduced. As a result of this shape of the resin portion 450F, the bonding strength of the solder bonding portions 400 is further improved.

The contact angle of the liquid thermosetting resin with respect to the image sensor 100F is controlled by changing, for example, the surface roughness of the main surface 111F of the insulating substrate 102F serving as the surface of the image sensor 100F, and/or the material of the insulating substrate 102F. The contact angle of the liquid thermosetting resin with respect to the printed wiring board 200F is controlled by changing, for example, the surface roughness of the surface 241F of the solder resist layer 240F serving as the surface of the printed wiring board 200F, and/or the material of the solder resist layer 240F. Controlling the contact angle of the resin with respect to each of the image sensor 100F and the printed wiring board 200F by changing the surface roughness of each of the image sensor 100F and the printed wiring board 200F is preferable for the ease of manufacture.

The contact angle of the liquid thermosetting resin with respect to the image sensor 100F is preferably smaller than the contact angle of the liquid thermosetting resin with respect to the printed wiring board 200F. That is, the angle θ1 is preferably smaller than the angle θ2 in the resin portion 450F. As a result of this, the bonding strength is further improved. To make the angle θ1 smaller than the angle θ2, in the present exemplary embodiment, the surface roughness of a portion of the image sensor 100F where the image sensor 100F is in contact with the resin portion 450F is set to be larger than the surface roughness of a portion of the printed wiring board 200F where the printed wiring board 200F is in contact with the resin portion 450F. That is, the surface roughness of the main surface 111F of the insulating substrate 102F is set to be larger than the surface roughness of the surface 241F of the solder resist layer 240F. Here, the surface roughness is, for example, arithmetic mean roughness. By setting different surface roughness in this manner, different contact angles are achieved in the reflow step.

Fourth Exemplary Embodiment

Figure 15B:
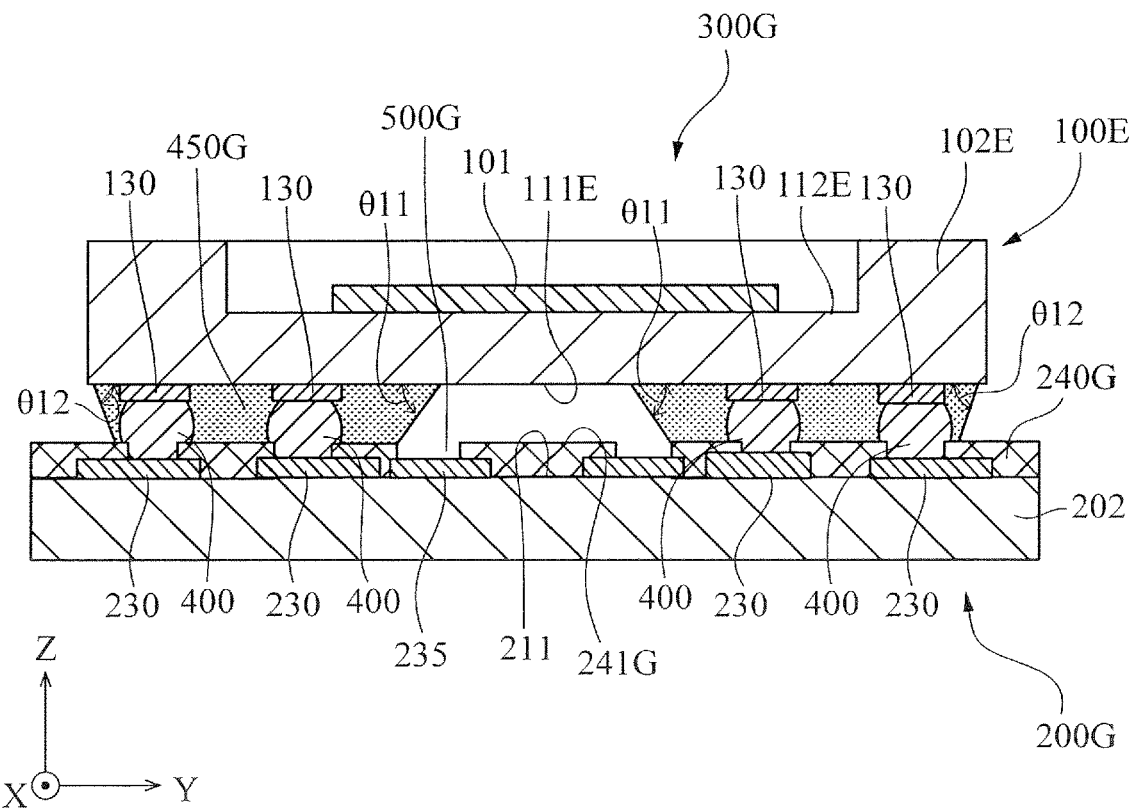
FIG. 15B is a section view of a printed circuit board according to a fourth exemplary embodiment.

A printed circuit board of a digital camera serving as an example of an electronic device according to a fourth exemplary embodiment will be described. FIG. 15B is a section view of a printed circuit board 300G according to the fourth exemplary embodiment. The printed circuit board 300G illustrated in FIG. 15B includes the image sensor 100E similarly to the second exemplary embodiment, the printed wiring board 200G, and the plurality of solder bonding portions 400 similarly to the first exemplary embodiment. The printed wiring board 200G of the fourth exemplary embodiment includes the insulating substrate 202 on which the plurality of lands 230 are provided similarly to the printed wiring board 200 of the first exemplary embodiment, and a solder resist layer 240G is formed on the main surface 211 of the insulating substrate 202. An opening 500G similar to the opening 500 of the first exemplary embodiment is provided in the solder resist layer 240G. The opening 500G is a recess portion recessed with respect to the surface of the printed wiring board 200G, that is, the surface 241G of the solder resist layer 240G. The opening 500G is defined in a ring shape, and the conductor pattern 235 that is a base is exposed through the opening 500G. Further, the printed circuit board 300G includes a resin portion 450G that is in contact with the image sensor 100E at an acute angle similarly to the printed circuit board 300E of the second exemplary embodiment. That is, the angles θ11 and θ12 of the resin portion 450G are acute angles similarly to the second exemplary embodiment.

According to the fourth exemplary embodiment, the flow of resin is effectively suppressed by the opening 500G similarly to the first exemplary embodiment. In addition, as a result of the resin portion 450G being in contact with the image sensor 100E at an acute angle, a structure in which stress is not likely to be concentrated on the contact interface between the bottom surface of the image sensor 100E and the thermosetting resin is formed similarly to the second exemplary embodiment. As a result of this, the bonding strength and the bonding reliability of the solder bonding portions 400 are improved.

To be noted, in the printed circuit board 300G of the fourth exemplary embodiment, openings like ones in Modification Examples 1, 2, 3, and 5 may be used instead of the opening 500G. In addition, the lands 237 may be added similarly to Modification Example 4. In addition, although a second contact angle at which the resin portion 450G of the fourth exemplary embodiment is in contact with the printed wiring board 200G is an obtuse angle, it is preferable that the second contact angle is an acute angle similarly to the third exemplary embodiment. At this time, it is preferable that the angle of a portion of the resin portion where the resin portion is in contact with the image sensor is smaller than the angle of a portion of the resin portion where the resin portion is in contact with the printed wiring board.

Example 2

As Example 2, a case where the printed circuit board 300E illustrated in FIG. 10 was manufactured by the manufacturing method described in the second exemplary embodiment will be described. The image sensor 100E of Example 2 was an LGA package. The area of the bottom surface of the image sensor 100E was 900 mm$^2$, the total area of the lands 130 was 150 mm$^2$, and the number of effective terminals formed from solder was 300. The material of the insulating substrate 102E of the image sensor 100E was alumina ceramics.

The insulating substrate 202 of the printed wiring board 200E was FR-4. The size of the outer shape of the insulating substrate 202 was about 50.0 mm×50.0 mm. The thickness of the solder resist layer 240E was about 0.02 mm. The material of the lands 230 was Cu. The diameter of each land 230 was 1.0 mm, and the lands 230 were arranged in a grid shape at a pitch of 1.6 mm.

In step S3E illustrated in FIG. 12C, the paste P was provided on the lands 230 by screen printing. A printing plate having a thickness of 0.02 mm was used for the screen printing. The paste P contained a bisphenol-A epoxy resin as the thermosetting resin, and a curing agent that reacts with the epoxy resin. The alloy composition of the solder powder was a eutectic composition of tin-58 bismuth having a melting point of 139° C., and the average particle diameter thereof was 40 μm. The amount of the solder powder added in the paste P was about 40 vol %, and the remainder includes the thermosetting resin, the curing agent, and a small amount of a flux component for securing a solder bonding property.

The area of a region surrounded by the lands on the most inner peripheral side among the plurality of lands 230 was set to 180 mm². In addition, the mixture ratio of the thermosetting resin in the solder paste was set to 60 vol %.

In addition, such members that a surface roughness Ra1 of the insulating substrate 102E serving as the bottom surface of the image sensor 100E was larger than a surface roughness Ra2 of the solder resist layer 240E of the printed wiring board 200E were used. In Example 2, such members that the surface roughness Ra1 of the bottom surface of the image sensor 100E was 333.9 nm in terms of arithmetic mean roughness were used. In addition, in Example 2, such members that the surface roughness Ra2 of the solder resist layer 240E of the printed wiring board 200E was 39.7 nm, which was smaller than the surface roughness Ra1, were used.

In step S4E illustrated in FIG. 13A, the image sensor 100E of an LGA type was mounted, by using a mounter, on the printed wiring board 200E on which the paste P was supplied. At this time, the lands 130 were positioned so as to oppose the lands 230 of the printed wiring board 200E to which the lands 130 were to be bonded.

Next, the paste P was heated in step S5E-1 illustrated in FIG. 13B and step S5E-2 illustrated in FIG. 13C. The profile of temperature inside the reflow furnace 1000 at this time is illustrated in FIG. 9. In step S5E-1, as illustrated in FIG. 9, the temperature inside the reflow furnace 1000 was adjusted to a temperature equal to or higher than 139° C., which was the melting point of the solder, and thus the solder in the paste P was melted. As a result of this, the paste P was separated into the molten solder 401 and the thermosetting resin 451E.

Then, as illustrated in FIG. 9, in step S5E-2, the temperature inside the reflow furnace 1000 was adjusted to a temperature required for thermal curing and lower than 139° C., which was the melting point of solder, and thus the thermosetting resin 451E was cured. The wet-spreading shape of the liquid thermosetting resin 451E, that is, the shape of the resin portion 450E after curing was successfully maintained in the state of an acute angle with respect to the image sensor 100E. To be noted, the acute angle shape of the resin portion 450E was not achieved when the surface roughness Ra2 of the solder resist layer 240E of the printed wiring board 200E was 50 nm or smaller in terms of arithmetic surface roughness.

The printed circuit board 300E manufactured by the manufacturing method described above was disassembled into the image sensor 100E and the printed wiring board 200E as illustrated in FIGS. 14A and 14B. The thermosetting resin was observed on each of the image sensor 100E and the printed wiring board 200E. By comparing the trace of the resin portion 450E on the image sensor 100E side with the trace of the resin portion 450E on the printed wiring board 200E side, it was confirmed that the resin portion 450E on the image sensor 100E spread in a wider range than the resin portion 450E on the printed wiring board 200E. The resin portion 450E being in contact with the image sensor 100E at an acute angle is also backed up by the trace of the resin portion 450E. In addition, from the fact that a trace of thermosetting resin was left on the image sensor 100E side, it was confirmed that high bonding strength with the insulating substrate 102E formed from an inorganic material was achieved. Further, the surface roughness of 333.9 nm of the bottom surface of the image sensor 100E was as about ten times as large as the surface roughness of 39.7 nm of the surface of the solder resist layer 240E of the printed wiring board 200E. From this fact, it was confirmed that the bonding strength was enhanced on the image sensor 100E side by an anchor effect exerted by the irregularity of the surface.

Example 3

As Example 3, a case where the printed circuit board 300F illustrated in FIG. 15A described above was manufactured will be described. In Example 3, the surface roughness Ra1 of the main surface 111F of the image sensor 100F in terms of arithmetic mean roughness was set to 333.9 nm. The surface roughness Ra2 of the surface 241F of the solder resist layer 240F of the printed wiring board 200F in terms of arithmetic mean roughness was set to 100 nm.

The contact angle of the liquid thermosetting resin with respect to the bottom surface of the image sensor 100F and the contact angle of the liquid thermosetting resin with respect to the mounting surface of the printed wiring board 200F were measured. As a result, it was confirmed that both of the contact angles were smaller than 90°, that is, were acute angles. Further, it was confirmed that the contact angle of the liquid thermosetting resin with respect to the image sensor 100F was smaller than the contact angle of the liquid thermosetting resin with respect to the printed wiring board 200F. The resin portion 450F after thermal curing was in contact with both of the image sensors 100F and the printed wiring board 200F at acute angles. It was confirmed that the bonding strength between the image sensor 100F and the printed wiring board 200F was enhanced more than in Example 2.

Further, as Comparative Example, an experiment using an image sensor serving as an electronic part whose contact angle with the thermosetting resin was an obtuse angle was also carried out. In this Comparative Example, since the contact angle was an obtuse angle, stress was likely to be concentrated on the contact interface between the thermosetting resin and the image sensor in a direction of peeling the thermosetting resin off, and thus the bonding strength and the bonding reliability of the solder bonding portions were poor.

Next, inspection of the solder bonding portions 400 was performed by using an X-ray transmission observation apparatus on the printed circuit board 300F manufactured by the manufacturing method described above. As a result, no bonding defect of solder bridges between adjacent solder bonding portions 400 was observed. In addition, no conduction defect was observed in inspection of the solder bonding portions 400 by an electrical test. Since the heating step for curing the thermosetting resin was performed at a low temperature of 130° C., which was lower than the melting point of solder, the amount of thermal deformation of the image sensor 100F was small, and sufficient optical performance of the image sensor 100F was guaranteed.

To be noted, the present invention is not limited to the exemplary embodiments and examples described above, and can be modified in many ways within the technical concept of the present invention. In addition, effects described in the exemplary embodiments are mere enumeration of the most preferable effects that can be achieved by the present invention, and effects of the present invention is not limited to ones described in the exemplary embodiments.

Although a printed circuit board including an image sensor as an exemplary electronic part was described in the exemplary embodiments including Modification Examples described above, the configuration is not limited to this. For example, the printed circuit board 700 illustrated in FIG. 1 can be manufactured by the same manufacturing methods of the printed circuit boards 300 to 300G. In addition, the printed circuit board can be manufactured even if the electronic part is a memory integrated circuit: memory IC or a power source IC. In addition, although the digital camera 600 serving as an image pickup apparatus was described as an example of an electronic device in the exemplary embodiments described above, the configuration is not limited to this. For example, the electronic device may be an electronic device other than an image pickup apparatus such as an image forming apparatus or a mobile communication device. Examples of the image forming apparatus include a printer.

Although a case where the paste P is disposed on the printed wiring board in the step of disposing the paste P has been described in the exemplary embodiments described above, the configuration is not limited to this, and the paste P may be disposed on the electronic part. In addition, the paste P may be disposed on both of the printed wiring board and the electronic part.

In addition, although it is preferable that a recess portion is defined by the solder resist layer, the configuration is not limited to this. A recess portion recessed with respect to the surface may be directly defined in the base portion of the printed wiring board.

In addition, although the electronic part is preferably an LGA or LCC package, the configuration is not limited to this. That is, the present invention can be also applied to an electronic part of packages other than LGA and LCC in which a plurality of lands are formed on the bottom surface thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electronic module comprising:
an upper part comprising a first land;
a lower part comprising a main surface, an insulating layer and a second land, the main surface being disposed to face the first land, the insulating layer being configured to surround the second land in a plan view, the second land and the insulating layer being provided on the main surface;
a conductive bonding portion configured to bond the first land and the second land; and
a resin portion containing a cured product of a resin and configured to bond the upper part and the insulating layer of the lower part, at least a part of the resin portion being in contact with the conductive bonding portion,
wherein the insulating layer comprises a first surface in contact with the resin portion and a wall portion provided in a position apart from the second land, the wall portion configured to form an edge portion with the first surface and to extend from the edge portion toward the main surface of the lower part, and
wherein the resin portion is configured to extend to the edge portion on the first surface.

2. The electronic module according to claim 1, wherein the lower part comprises a third land provided on a side opposite to the wall portion across the second land and a thickness of the third land is thinner than a thickness of the insulating layer.

3. The electronic module according to claim 1, wherein a space is provided between the main surface and the upper part on a side opposite to the second land across the wall portion and is located lower than a position where the insulating layer contacts the resin portion.

4. The electronic module according to claim 1, wherein the lower part comprises a second insulating layer disposed on a side opposite to the second land across the wall portion and a thickness of the second insulating layer is thinner than a thickness of the insulating layer.

5. The electronic module according to claim 1, wherein the resin portion is in contact with the upper part at an acute angle.

6. The electronic module according to claim 1, wherein the wall portion is disposed closer to a center of the main surface than the second land.

7. The electronic module according to claim 1, wherein the upper part is an electronic part,
wherein the lower part is a printed wiring board,
wherein the first land is one of a plurality of first lands of the electronic part and the second land is one of a plurality of second lands of the printed wiring board,
wherein the electronic part comprises a first region and a third region surrounding the first region, and the first lands are disposed in the third region, and
wherein the printed wiring board comprises a second region and a fourth region surrounding the second region, and the second lands are disposed in the fourth region.

8. The electronic module according to claim 7, wherein the electronic part is a land grid array package or a leadless chip carrier package.

9. The electronic module according to claim 1, wherein a minimum distance between the second land and the wall portion is 0.5 mm to 5.0 mm.

10. An electronic device comprising:
a casing; and
the electronic module according to claim 1 disposed in the casing.

11. The electronic device according to claim 10, wherein the electronic device is a mobile communication device.

12. The electronic device according to claim 10, wherein the electronic device is a camera.

13. An electronic module comprising:
an upper part comprising a first land;
a lower part comprising a main surface, an insulating layer and a second land, the main surface being disposed to face the first land, the insulating layer being configured to surround the second land in a plan view, the second land and the insulating being provided on the main surface;
a conductive bonding portion configured to bond the first land and the second land; and
a resin portion containing a cured product of a thermosetting resin and configured to bond the upper part and the insulating layer of the lower part, at least a part of the resin portion being in contact with the conductive bonding portion,
wherein the resin portion comprises a first portion being in contact with the upper part at an acute angle.

14. The electronic module according to claim 13, wherein the resin portion comprises a second portion being in contact with the upper part at an acute angle and the first portion is disposed closer to a center of the lower part than the second portion.

15. The electronic module according to claim 14, wherein a contact angle of the first portion with the upper part is smaller than a contact angle of the second portion with the upper part.

16. The electronic module according to claim 13, wherein a surface roughness of a portion of the upper part at which the upper part is in contact with the resin portion is larger than a surface roughness of a portion of the insulating layer at which the insulating layer is in contact with the resin portion.

17. The electronic module according to claim 16, wherein the surface roughness of the portion of the upper part at which the upper part is in contact with the resin portion is equal to or larger than 100 nm.

18. The electronic module according to claim 13, wherein the upper part is an electronic part,
wherein the lower part is a printed wiring board,
wherein the first land is one of a plurality of first lands of the electronic part and the second land is one of a plurality of second lands of the printed wiring board,
wherein the electronic part comprises a first region and a third region surrounding the first region, and the first lands are disposed in the third region,
wherein the printed wiring board comprises a second region and a fourth region surrounding the second region, and the second lands are disposed in the fourth region, and
wherein the first portion is in contact with the first region.

19. The electronic module according to claim 18, wherein the electronic part is a land grid array package or leadless chip carrier package.

20. An electronic device comprising:
a casing; and
the electronic module according to claim 13 disposed in the casing.

21. The electronic device according to claim 20, wherein the electronic device is a mobile communication device.

22. The electronic device according to claim 20, wherein the electronic device is a camera.

* * * * *